(12) United States Patent
Lin et al.

(10) Patent No.: US 10,217,710 B2
(45) Date of Patent: Feb. 26, 2019

(54) WIRING BOARD WITH EMBEDDED COMPONENT AND INTEGRATED STIFFENER, METHOD OF MAKING THE SAME AND FACE-TO-FACE SEMICONDUCTOR ASSEMBLY USING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 15/917,551

(22) Filed: Mar. 9, 2018

(65) Prior Publication Data

US 2018/0197818 A1    Jul. 12, 2018

Related U.S. Application Data

(63) Continuation-in-part of application No. 15/283,305, filed on Oct. 1, 2016, now Pat. No. 9,947,625, which
(Continued)

(51) Int. Cl.
*H01L 23/538* (2006.01)
*H01L 21/48* (2006.01)
(Continued)

(52) U.S. Cl.
CPC ........ *H01L 23/5389* (2013.01); *H01L 21/486* (2013.01); *H01L 21/52* (2013.01);
(Continued)

(58) Field of Classification Search
CPC .......... H01B 7/18; H01B 3/441; H01B 3/443; H01B 3/445; H01B 7/0225; H01B 7/189;
(Continued)

(56) References Cited

U.S. PATENT DOCUMENTS 7,851,269 B2   12/2010   Muthukumar et al.
7,902,660 B1    3/2011   Lee et al.
(Continued)

*Primary Examiner* — Steven T Sawyer
(74) *Attorney, Agent, or Firm* — Pai Patent & Trademark Law Firm; Chao-Chang David Pai

(57) ABSTRACT

A wiring board includes an electronic component laterally surrounded by a stiffener, and a third routing circuitry disposed beyond the space laterally surrounded by the stiffener and extends over the stiffener. The electronic component includes a first routing circuitry, an encapsulant, an array of vertical connecting elements and a second routing circuitry integrated together. The mechanical robustness of the stiffener can prevent the wiring board from warping. The embedded semiconductor device is electrically coupled to the first routing circuitry and surrounded by the vertical connecting elements in electrical connection with the first and second routing circuitries. The first routing circuitry provides primary fan-out routing for another semiconductor device to be assembled on the wiring board, whereas the third routing circuitry not only provides further fan-out wiring structure, but also mechanically binds the electronic component with the stiffener.

12 Claims, 20 Drawing Sheets

Related U.S. Application Data is a continuation-in-part of application No. 14/746,792, filed on Jun. 22, 2015, now abandoned.

(60) Provisional application No. 62/092,196, filed on Dec. 15, 2014, provisional application No. 62/121,450, filed on Feb. 26, 2015.

(51) Int. Cl.
| | | |
|---|---|---|
| *H01L 21/52* | (2006.01) | |
| *H05K 1/18* | (2006.01) | |
| *H01L 25/065* | (2006.01) | |
| *H01L 23/498* | (2006.01) | |
| *H01L 23/00* | (2006.01) | |
| *H01L 23/31* | (2006.01) | |

(52) U.S. Cl.
CPC .... *H01L 23/49827* (2013.01); *H01L 25/0657* (2013.01); *H05K 1/181* (2013.01); *H01L 23/3128* (2013.01); *H01L 23/562* (2013.01); *H01L 2224/16225* (2013.01); *H01L 2224/97* (2013.01); *H01L 2924/181* (2013.01)

(58) Field of Classification Search
CPC ...... H01B 7/295; H01B 9/006; H01B 13/141; H01B 13/142; H01B 13/24; H01L 23/4334; H01L 23/5389; H01L 21/486; H01L 21/52; H01L 21/6835; H01L 21/3121; H05K 1/0271; H05K 3/4682; H05K 1/183
USPC .................................. 438/123; 257/667, 778
See application file for complete search history.

(56) References Cited

U.S. PATENT DOCUMENTS

| | | |
|---|---|---|
| 7,981,728 B2 | 7/2011 | Cho |
| 8,227,703 B2 | 7/2012 | Maruyama et al. |
| 8,453,323 B2 | 6/2013 | Sakamoto et al. |
| 8,501,544 B2 | 8/2013 | Pagaila |
| 8,525,337 B2 | 9/2013 | Pendse |
| 8,536,715 B2 | 9/2013 | Chino |
| 8,618,652 B2 | 12/2013 | Nalla et al. |
| 8,836,114 B2 | 9/2014 | Oh et al. |
| 2006/0249828 A1* | 11/2006 | Hong ............... H01L 25/0652 257/686 |
| 2014/0048951 A1* | 2/2014 | Lin ..................... H01L 23/481 257/774 |
| 2015/0084206 A1* | 3/2015 | Lin ..................... H01L 23/3135 257/774 |

* cited by examiner

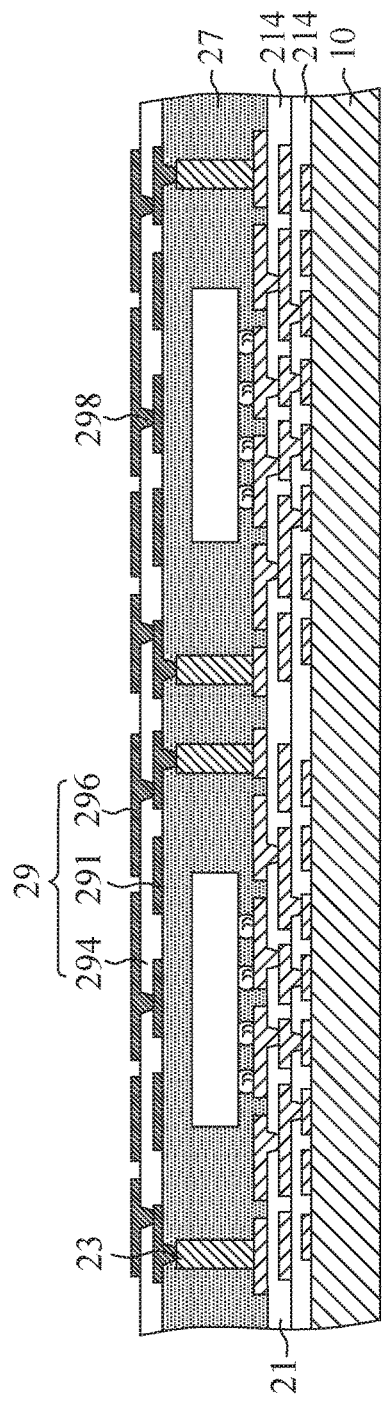
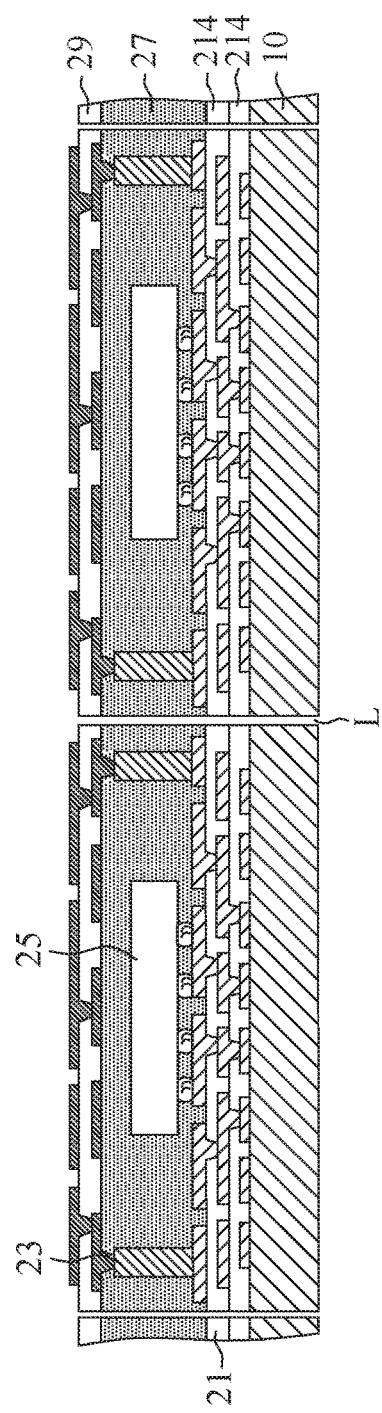
FIG.24
FIG.25

WIRING BOARD WITH EMBEDDED COMPONENT AND INTEGRATED STIFFENER, METHOD OF MAKING THE SAME AND FACE-TO-FACE SEMICONDUCTOR ASSEMBLY USING THE SAME

CROSS REFERENCE TO RELATED APPLICATIONS

This application is a continuation-in-part of U.S. application Ser. No. 15/283,305 filed Oct. 1, 2016. The U.S. application Ser. No. 15/283,305 is a continuation-in-part of U.S. application Ser. No. 14/746,792 filed Jun. 22, 2015, now abandoned. The U.S. application Ser. No. 14/746,792 claims the priority benefit of U.S. Provisional Application Ser. No. 62/092,196 filed Dec. 15, 2014, and the priority benefit of U.S. Provisional Application Ser. No. 62/121,450 filed Feb. 26, 2015. The entirety of each of said applications is incorporated herein by reference.

FIELD OF THE INVENTION

The present invention relates to a wiring board and, more particularly, to a wiring board having an embedded component and an integrated stiffener, and a method of making the same and a face-to-face semiconductor assembly using the same.

DESCRIPTION OF RELATED ART

Market trends of multimedia devices demand for faster and slimmer designs. One of the approaches is to embed an electronic device such as resistor, capacitor in a wiring board so that the electrical performance of the board can be improved. In the case when a memory or a logic chip is embedded in the board, another device(s) can be assembled on the board so as to form a chip-on-chip 3D stacking structure. U.S. Pat. Nos. 8,453,323, 8,525,337, 8,618,652 and 8,836,114 disclose various wiring boards having an embedded device for such purposes. However, in addition to poor warping control, other features such as design flexibility are not addressed.

For the reasons stated above, and for other reasons stated below, an urgent need exists to develop a new wiring board having embedded device that can address routing requirement and ensure ultra-high packaging density, high signal integrity, low profile and low warpage.

SUMMARY OF THE INVENTION

A primary objective of the present invention is to provide a wiring board with a first routing circuitry, an embedded semiconductor device, an encapsulant, an array of vertical connecting elements and a second routing circuitry positioned within a space laterally surrounded by a stiffener so that the central area warping and bending of the wiring board can be suppressed, thereby improving production yield and device-level reliability.

The wiring board of the present invention may further include a third routing circuitry positioned outside of the space laterally surrounded by the stiffener and electrically connected to the first routing circuitry through the second routing circuitry and the vertical connecting elements, so that the outmost area warping and bending of the wiring board is well controlled and high routing flexibility can be achieved by the first, second and third routing circuitries. For instance, the first routing circuitry can be configured as primary fan-out circuitry with very high routing density, and the third routing circuitry can be configured as further fan-out circuitry with much coarser line/space for next-level board assembling.

In accordance with the foregoing and other objectives, the present invention provides a wiring board that includes a first routing circuitry, a first semiconductor device, an encapsulant, an array of vertical connecting elements, a second routing circuitry, a stiffener and a third routing circuitry. The first routing circuitry, the first semiconductor device, the encapsulant, the vertical connecting elements and the second routing circuitry are integrated as an electronic component surrounded by the stiffener. In a preferred embodiment, the stiffener, having an interior sidewall surface adjacent to peripheral edges of the electronic component, provides a high modulus anti-warping platform for the wiring board; the first semiconductor device, flip-chip mounted on the first routing circuitry, is sealed in the encapsulant and surrounded by the vertical connecting elements; the first routing circuitry, adjacent to one side of the encapsulant, provides primary fan-out routing for a second semiconductor device to be assembled thereon and offers the shortest routing distance between the first and second semiconductor devices; the second routing circuitry, adjacent to the other side of the encapsulant, provides secondary fan-out routing and offers electrical contacts for next-level routing circuitry connection; the vertical connecting elements, positioned between the first and second routing circuitries, offers electrical connection between the first routing circuitry and the second routing circuitry; and the third routing circuitry, adjacent to the second routing circuitry and laterally extending on the stiffener, mechanically binds the electronic component with the stiffener and provides further fan-out routing and has pad pith and size that match the next level assembly.

In another aspect, the present invention provides a wiring board, comprising: an electronic component that includes a first semiconductor device, an encapsulant, an array of vertical connecting elements, a first routing circuitry and a second routing circuitry, wherein (i) the first semiconductor device and the vertical connecting elements are electrically coupled to the first routing circuitry, (ii) the encapsulant laterally covers the first semiconductor device and the vertical connecting elements and has a first surface facing in the first routing circuitry and a second surface opposite to the first surface, and (iii) the second routing circuitry is disposed on the second surface of the encapsulant and electrically connected to the first routing circuitry through the vertical connecting elements; a stiffener that laterally surrounds the electronic component and has interior sidewall surface adjacent to peripheral edges of the electronic component; and a third routing circuitry that is disposed over the second routing circuitry and laterally extends over the stiffener, wherein the third routing circuitry is electrically coupled to the second routing circuitry. Further, the present invention also provides a face-to-face semiconductor assembly that includes the aforementioned wiring board and a second semiconductor device face-to-face electrically coupled to the first semiconductor device through the first routing circuitry between the first semiconductor device and the second semiconductor device.

In yet another aspect, the present invention provides a method of making, comprising steps of: providing an electronic component over a sacrificial carrier, the electronic component including a semiconductor device, an encapsulant, an array of vertical connecting elements, a first routing circuitry and a second routing circuitry, wherein (i) the first routing circuitry is detachably adhered over the sacrificial carrier and adjacent to a first surface of the encapsulant, (ii) the semiconductor device and the vertical connecting elements are embedded in the encapsulant and electrically coupled to the first routing circuitry, and (iii) the second routing circuitry is disposed on a second surface of the encapsulant opposite to the first surface and electrically connected to the first routing circuitry through the vertical connecting elements; providing a stiffener that laterally surrounds the electronic component and the sacrificial carrier; forming a third routing circuitry that is disposed over the second routing circuitry and laterally extends over the stiffener, wherein the third routing circuitry is electrically coupled to the second routing circuitry; and removing the sacrificial carrier from the first routing circuitry.

Unless specifically indicated or using the term "then" between steps, or steps necessarily occurring in a certain order, the sequence of the above-mentioned steps is not limited to that set forth above and may be changed or reordered according to desired design.

The method of making a wiring board according to the present invention has numerous advantages. For instance, combining the sacrificial carrier and the electronic component with the stiffener before the formation of the third routing circuitry is particularly advantageous as the sacrificial carrier together with the stiffener provides a stable platform for forming the third routing circuitry. Forming the encapsulant on the first routing circuitry can provides another high modulus anti-warping platform for the wiring board, so that the warping after removal of the sacrificial carrier can be suppressed by the mechanical robustness of the encapsulant and the stiffener. Additionally, the three-stage formation of the interconnect substrate can avoid serious warping problem when multiple layers of routing circuitries are needed.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which:

FIG. 24 is a cross-sectional view of the structure of FIG. 23 further provided with a dielectric layer and a conductive trace layer to finish the formation of a second routing circuitry on the encapsulant in accordance with the second embodiment of the present invention;

FIG. 25 is a cross-sectional view of a diced state of the panel-scale structure of FIG. 24 in accordance with the second embodiment of the present invention;

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-17 are schematic views showing a method of making a wiring board that includes a first routing circuitry, a first semiconductor device, an array of vertical connecting elements, an encapsulant, a second routing circuitry, a stiffener and a third routing circuitry in accordance with the first embodiment of the present invention.

Figure 1:
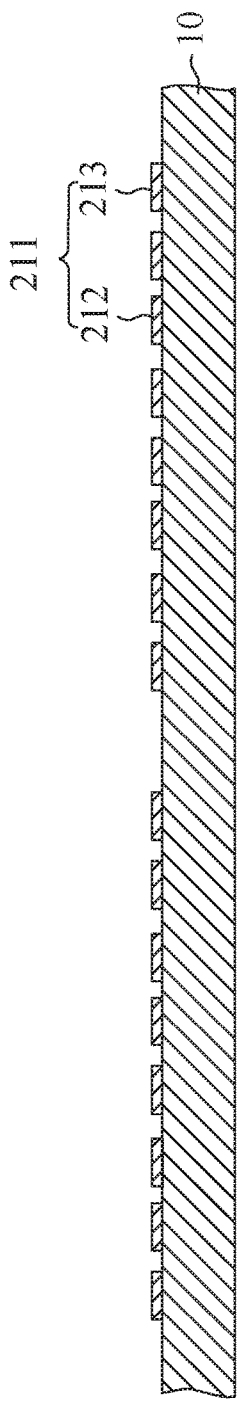
FIGS. 1 and 2 are cross-sectional and top perspective views, respectively, of the structure with a routing layer formed on a sacrificial carrier in accordance with the first embodiment of the present invention.
Figure 2:
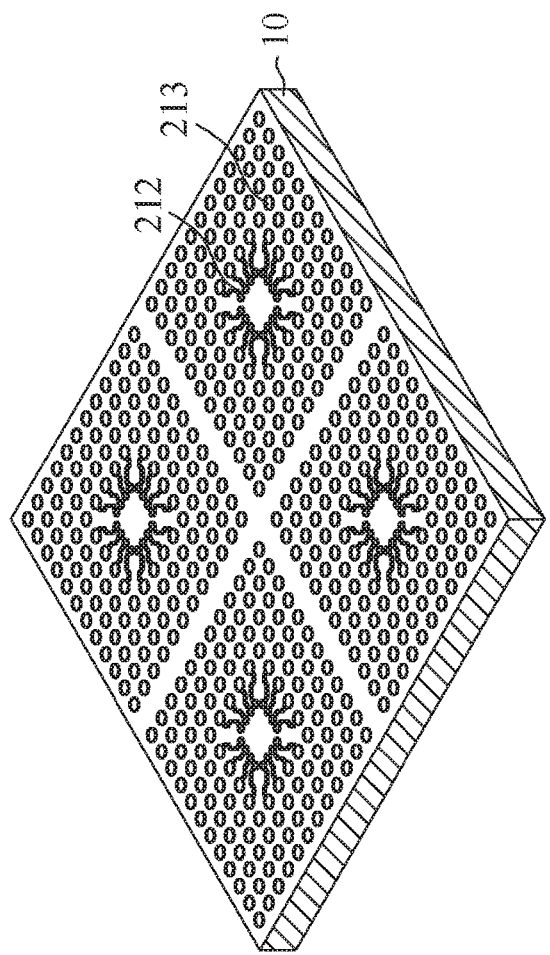

FIGS. 1 and 2 are cross-sectional and top perspective views, respectively, of the structure with a routing layer 211 formed on a sacrificial carrier 10 by metal deposition and metal patterning process. In this illustration, the sacrificial carrier 10 is a single-layer structure, and the routing layer 211 includes bond pads 212 and stacking pads 213. The sacrificial carrier 10 typically is made of copper, aluminum, iron, nickel, tin, stainless steel, silicon, or other metals or alloys, but any other conductive or non-conductive material also may be used. The thickness of the sacrificial carrier 10 preferably ranges from 0.1 to 2.0 mm. In this embodiment, the sacrificial carrier 10 is made of an iron-based material and has a thickness of 1.0 mm. The routing layer 211 typically is made of copper and can be pattern deposited by numerous techniques, such as electroplating, electroless plating, evaporating, sputtering or their combinations, or be thin-film deposited followed by a metal patterning process. For a conductive sacrificial carrier 10, the routing layer 211 is deposited typically by plating of metal. The metal patterning techniques include wet etching, electro-chemical etching, laser-assist etching, and their combinations with an etch mask (not shown) thereon that defines the routing layer 211.

Figure 3:
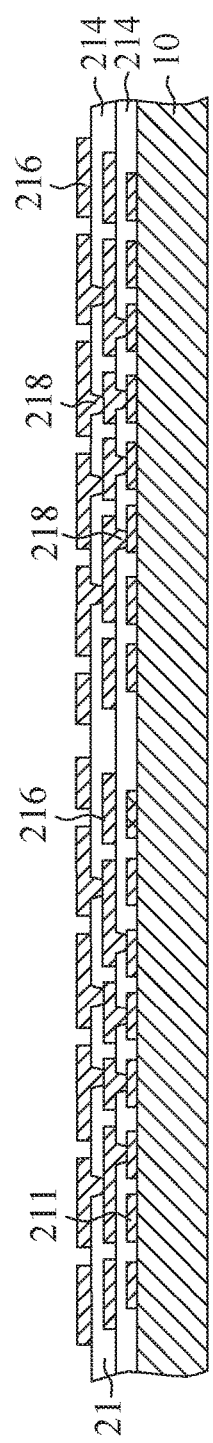
FIGS. 3 and 4 are cross-sectional and top perspective views, respectively, of the structure of FIGS. 1 and 2 further provided with multiple dielectric layers and multiple conductive trace layers to finish the formation of a first routing circuitry on the sacrificial carrier in accordance with the first embodiment of the present invention.
Figure 4:
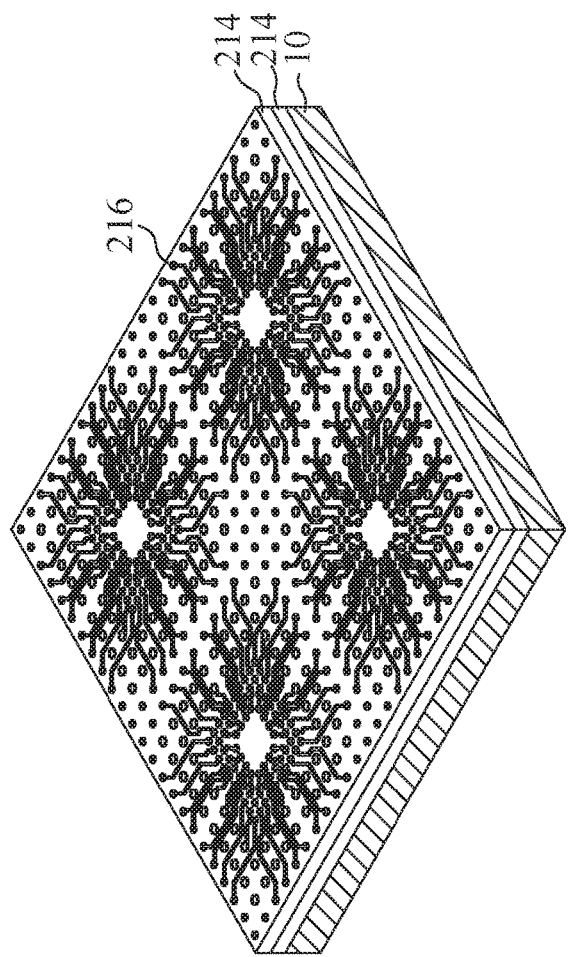

FIGS. 3 and 4 are cross-sectional and top perspective views, respectively, of the structure with multiple dielectric layers 214 and multiple conductive trace layers 216 serially formed in an alternate fashion. The dielectric layers 214 are deposited typically by lamination or coating, and can be made of epoxy resin, glass-epoxy, polyimide, or the like. The conductive trace layers 216 extend laterally on the dielectric layers 214 and include metallized vias 218 in the dielectric layers 214. As a result, the conductive trace layers 216 can be electrically coupled to each other through the metalized vias 218. Likewise, the innermost conductive trace layer 216 can be electrically coupled to the routing layer 211 through the metalized vias 218.

Each of the conductive trace layers 216 can be deposited as a single layer or multiple layers by any of numerous techniques, such as electroplating, electroless plating, evaporating, sputtering, or their combinations. For instance, the conductive trace layer 216 can be deposited by first dipping the structure in an activator solution to render the dielectric layer 214 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the conductive trace layer 216 by any of numerous techniques including wet etching, electro-chemical etching, laser-assist etching, and their combinations, with an etch mask (not shown) thereon that defines the conductive trace layer 216.

At this stage, the formation of a first routing circuitry 21 on the sacrificial carrier 10 is accomplished. In this illustration, the first routing circuitry 21 includes the routing layer 211, the dielectric layers 214 and the conductive trace layers 216.

Figure 5:
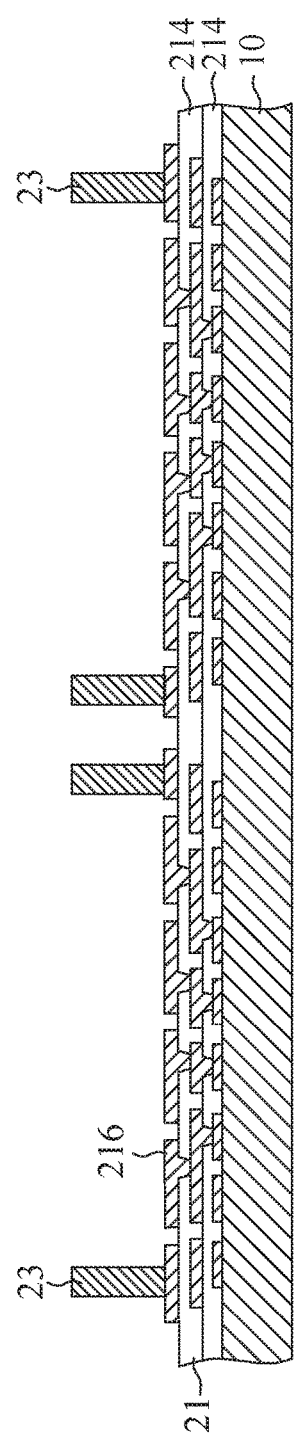
FIG. 5 is a cross-sectional view of the structure of FIG. 4 further provided with vertical connecting elements in accordance with the first embodiment of the present invention.

FIG. 5 is a cross-sectional view of the structure with an array of vertical connecting elements 23 on the first routing circuitry 21. In this illustration, the vertical connecting elements 23 are illustrated as metal pillars and electrically connected to and contact the outmost conductive trace layer 216 of the first routing circuitry 21.

Figure 6:
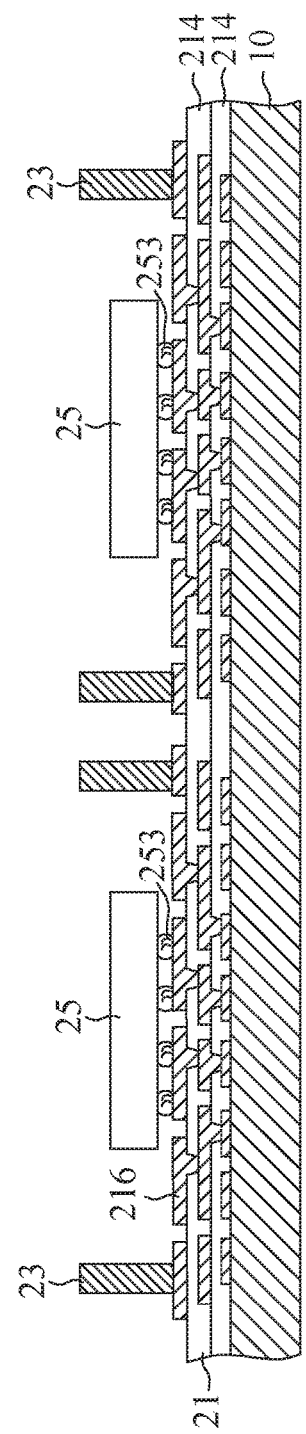
FIG. 6 is a cross-sectional view of the structure of FIG. 5 further provided with first semiconductor devices in accordance with the first embodiment of the present invention.

FIG. 6 is a cross-sectional view of the structure with first semiconductor devices 25 electrically coupled to the first routing circuitry 21. The first semiconductor devices 25, illustrated as bare chips, can be electrically coupled to the outmost conductive trace layer 216 of the first routing circuitry 21 using bumps 253 by thermal compression, solder reflow or thermosonic bonding.

Figure 7:
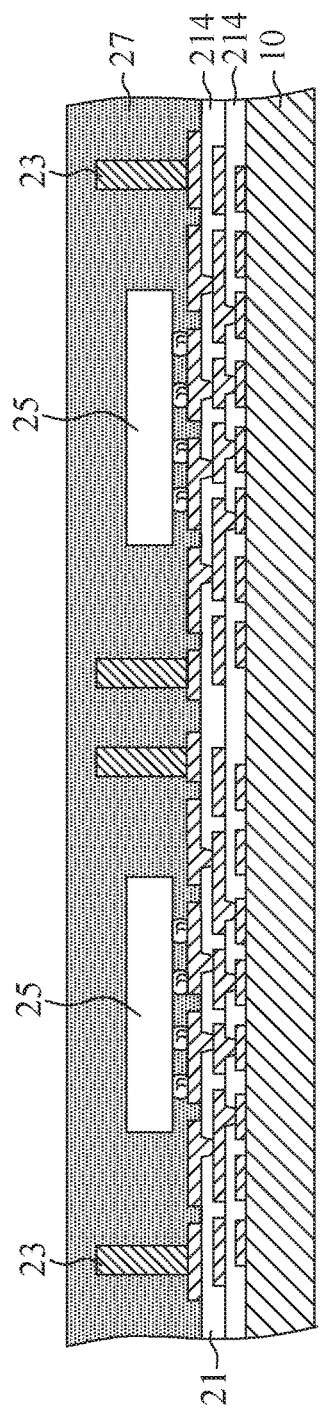
FIG. 7 is a cross-sectional view of the structure of FIG. 6 further provided with an encapsulant in accordance with the first embodiment of the present invention.

FIG. 7 is a cross-sectional view of the structure with an encapsulant 27 on the vertical connecting elements 23, the first semiconductor devices 25 and the first routing circuitry 21 by, for example, resin-glass lamination, resin-glass coating or molding. The encapsulant 27 covers the vertical connecting elements 23, the first semiconductor devices 25 and the first routing circuitry 21 from above and surrounds and conformally coats and covers sidewalls of the vertical connecting elements 23 and the first semiconductor devices 25.

Figure 8:
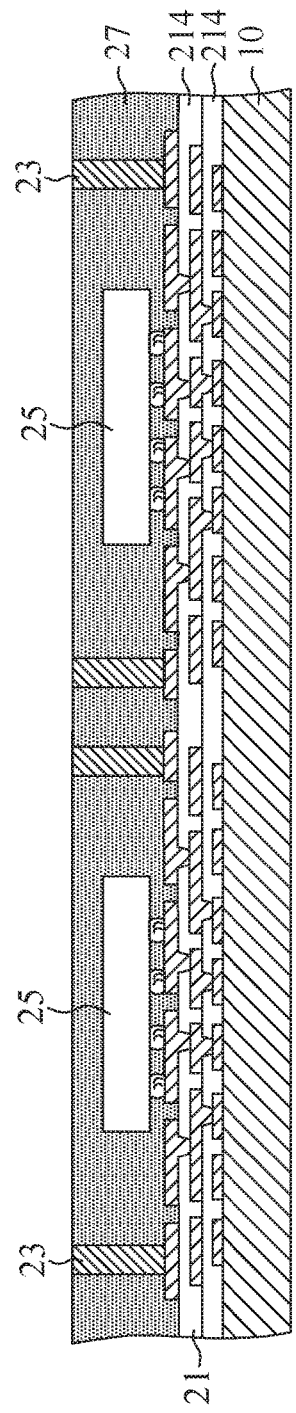
FIG. 8 is a cross-sectional view of the structure of FIG. 7 after removal of a top portion of the encapsulant in accordance with the first embodiment of the present invention.

FIG. 8 is a cross-sectional view of the structure with the vertical connecting elements 23 exposed from above. The upper portion of the encapsulant 27 can be removed by grinding. In this illustration, the vertical connecting elements 23 has an exposed surface substantially coplanar with an exterior surface of the encapsulant 27 from above.

Figure 9:
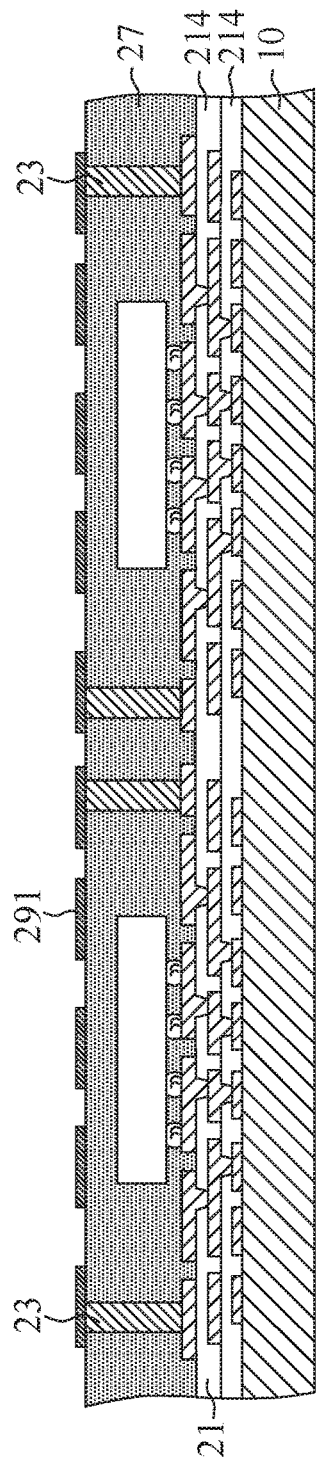
FIG. 9 is a cross-sectional view of the structure of FIG. 8 further provided with a routing layer in accordance with the first embodiment of the present invention.

FIG. 9 is a cross-sectional view of the structure provided with a routing layer 291 on the encapsulant 27 and electrically coupled to the vertical connecting elements 23 by metal pattern deposition described below. The top surface of the structure can be metallized to form an electrically conductive layer (typically a copper layer) as a single layer or multiple layers by numerous techniques, such as electroplating, electroless plating, evaporating, sputtering or their combinations. The electrically conductive layer can be made of Cu, Ni, Ti, Au, Ag, Al, their combinations, or other suitable electrically conductive material. Typically, a seeding layer is formed on the topmost surface of the structure prior to the electrically conductive layer is electroplated to a desirable thickness. The seeding layer may consist of a diffusion barrier layer and a plating bus layer. The diffusion barrier layer is to counterbalance oxidation or corrosion of the electrically conductive layer such as copper. In most cases, the diffusion barrier layer also acts as an adhesion promotion layer to the underlying material and is formed by physical vapor deposition (PVD) such as sputtered Ti or TiW with a thickness in a range from about 0.01 µm to about 0.1 µm. However, the diffusion barrier layer may be made of other materials, such as TaN, or other applicable materials and its thickness range is not limited to the range described above. The plating bus layer is typically made of the same material as the electrically conductive layer with a thickness in a range from about 0.1 µm to about 1 µm. For example, if the electrically conductive layer is copper, the plating bus layer would preferably be a thin film copper formed by physical vapor deposition or electroless plating. However, the plating bus layer may be made of other applicable materials such as silver, gold, chromium, nickel, tungsten, or combinations thereof and its thickness range is not limited to the range described above.

Following the deposition of the seeding layer, a photoresist layer (not shown) is formed over the seeding layer. The photoresist layer may be formed by a wet process, such as a spin-on process, or by a dry process, such as lamination of a dry film. After the photoresist layer is formed, the photoresist layer is patterned to form openings, which are then filled with plated metal such as copper to form the routing layer 291. After metal plating, the exposed seeding layer is then removed by etching process to form electrically isolated conductive traces as desired.

Figure 10:
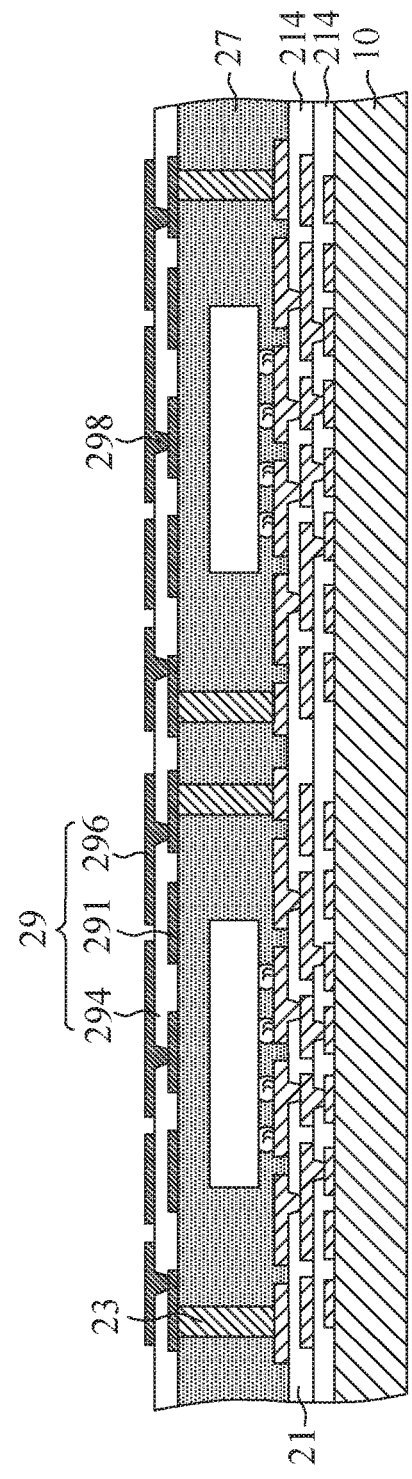
FIG. 10 is a cross-sectional view of the structure of FIG. 9 further provided with a dielectric layer and a conductive trace layer to finish the formation of a second routing circuitry on the encapsulant in accordance with the first embodiment of the present invention.

FIG. 10 is a cross-sectional view of the structure with a dielectric layer 294 and a conductive trace layer 296 serially formed in an alternate fashion. The dielectric layer 294 contacts and covers and extends laterally on the encapsulant 27 and the routing layer 291 from above. The conductive trace layer 296 extends laterally on the dielectric layer 294 and includes metallized vias 298 in the dielectric layer 294. As a result, the conductive trace layer 296 can be electrically coupled to the routing layer 291 through the metalized vias 298.

At this stage, a second routing circuitry 29 is accomplished and electrically connected to the first routing circuitry 21 through the vertical connecting elements 23. In this illustration, the second routing circuitry 29 includes the routing layer 291, the dielectric layer 294 and the conductive trace layer 296.

Figure 11:
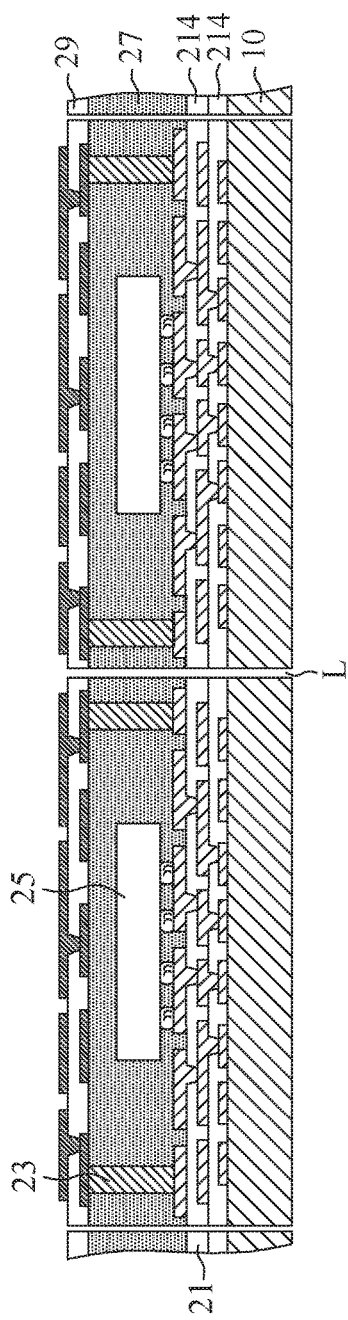
FIG. 11 is a cross-sectional view of a diced state of the panel-scale structure of FIG. 10 in accordance with the first embodiment of the present invention.

FIG. 11 is a cross-sectional view of the panel-scale structure of FIG. 10 diced into individual pieces. In this illustration, the panel-scale structure is singulated into individual pieces along dicing lines "L".

Figure 12:
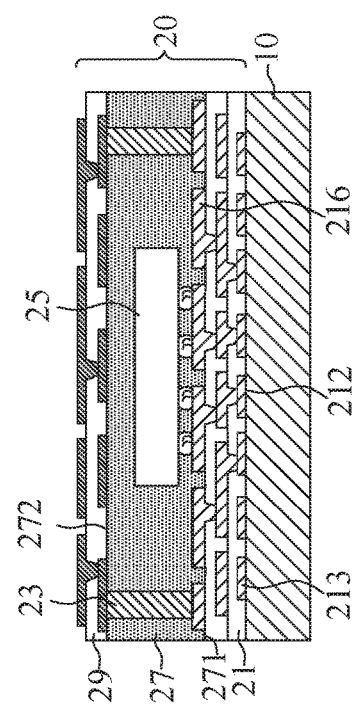
FIG. 12 is a cross-sectional view of the structure corresponding to a diced unit in FIG. 11 in accordance with the first embodiment of the present invention.

FIG. 12 is a cross-sectional view of an individual piece that includes a sacrificial carrier 10 and an electronic component 20 on the sacrificial carrier 10. The electronic component 20 includes the first routing circuitry 21, the vertical connecting elements 23, the first semiconductor device 25, the encapsulant 27 and the second routing circuitry 29. In this illustration, the first routing circuitry 21 and the second routing circuitry 29 are multi-layered buildup circuitries at two opposite sides of the encapsulant 27 and electrically connected to each other through the vertical connecting elements 23. The first routing circuitry 21 is detachably adhered on the sacrificial carrier 10 and adjacent to the first surface 271 of the encapsulant 27. The first routing circuitry 21 includes bond pads 212 and stacking pads 213 in contact with the sacrificial carrier 10. The first semiconductor device 25 is embedded in the encapsulant 27 and electrically coupled to the first routing circuitry 21. The vertical connecting elements 23 are sealed in the encapsulant 27 and surround the first semiconductor device 25 and extend from the first routing circuitry 21 to the second surface 272 of the encapsulant 27. The second routing circuitry 29 is disposed on the second surface 272 of the encapsulant 27 and electrically coupled to the vertical connecting elements 23.

Figure 13:
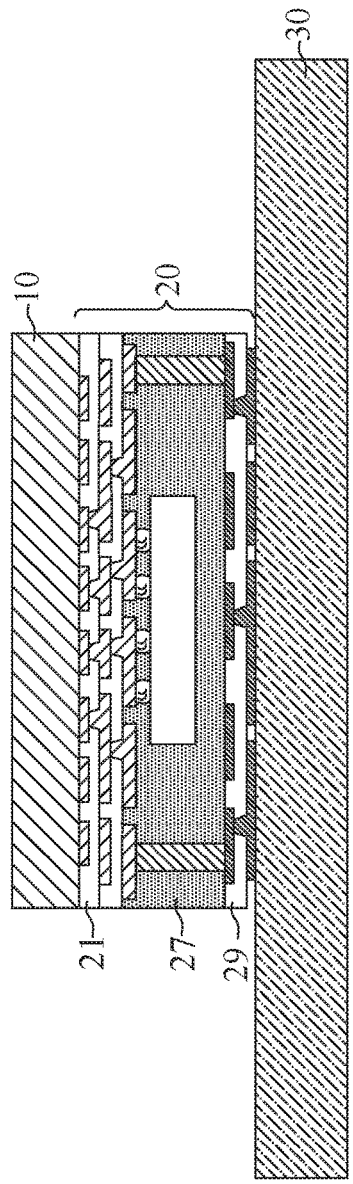
FIG. 13 is a cross-sectional view of the structure of FIG. 12 further provided with a temporary carrier in accordance with the first embodiment of the present invention.

FIG. 13 is a cross-sectional view of the structure provided with a temporary carrier 30 attached to the electronic component 20. The temporary carrier 30 can provide temporary retention force for the separated piece having the sacrificial carrier 10 and the electronic component 20. In this illustration, the separated piece steadily resides on the temporary carrier 30 by the adhesive property of the temporary carrier 30 in contact with the second routing circuitry 29.

Figure 14:
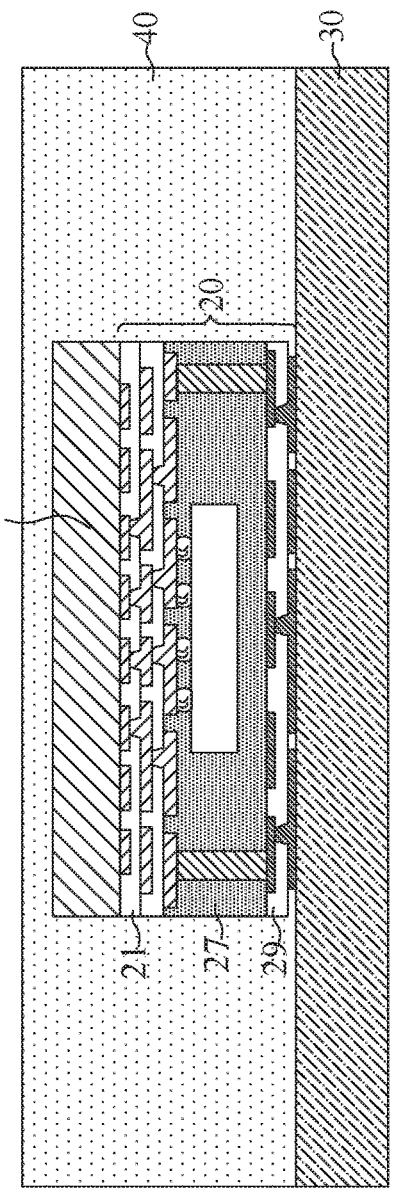
FIG. 14 is a cross-sectional view of the structure of FIG. 13 further provided with a stiffener in accordance with the first embodiment of the present invention.

FIG. 14 is a cross-sectional view of the structure provided with a stiffener 40. The stiffener 40 can be deposited by a molding process, a printing process or other methods such as lamination of epoxy or polyimide. The stiffener 40 covers the sacrificial carrier 10 and the temporary carrier 30 from above, laterally covers and surrounds and conformally coats the sidewalls of the sacrificial carrier 10 and the electronic component 20, and extends laterally from the sacrificial carrier 10 and the electronic component 20 to peripheral edges of the structure.

Figure 15:
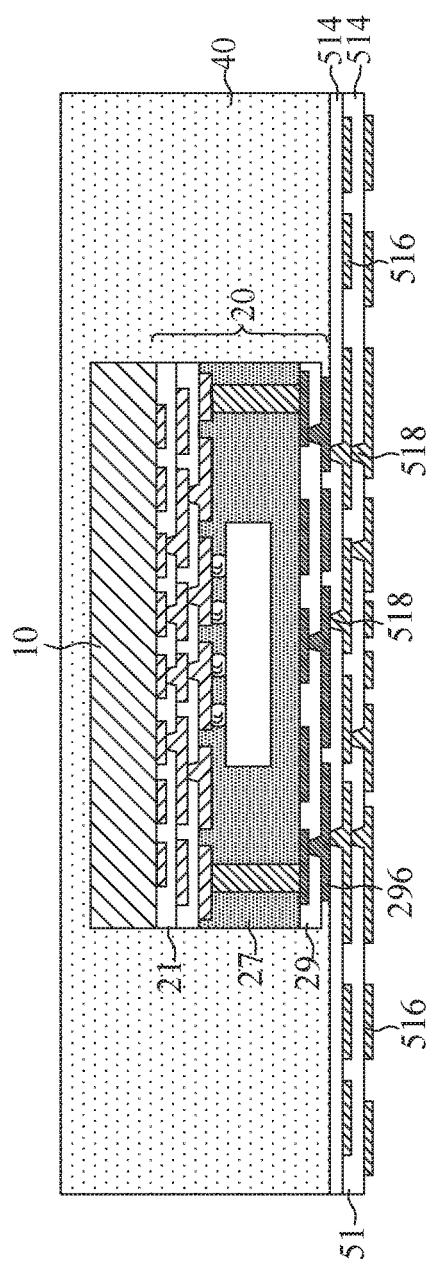
FIG. 15 is a cross-sectional view of the structure of FIG. 14 after removal of the temporary carrier and further provided with a third routing circuitry in accordance with the first embodiment of the present invention.

FIG. 15 is a cross-sectional view of the structure after removal of the temporary carrier 30 and deposition of a third routing circuitry 51 electrically coupled to the electronic component 20. The temporary carrier 30 is detached from the electronic component 20 and the stiffener 40, followed by forming the third routing circuitry 51 on the electronic component 20 and the stiffener 40. The third routing circuitry 51 laterally extends beyond peripheral edges of the second routing circuitry 29 and over a surface of the stiffener 40. In this illustration, the third routing circuitry 51 is a multi-layered buildup circuitry and includes multiple dielectric layers 514 and multiple conductive trace layers 516 serially formed in an alternate fashion. The dielectric layers 514 cover the electronic component 20 and the stiffener 40 from below. The conductive trace layers 516 extend laterally on the dielectric layers 514 and laterally extend beyond peripheral edges of the second routing circuitry 29. Further, the conductive trace layers 516 include metallized vias 518 in the dielectric layers 514. As a result, the conductive trace layers 516 can be electrically coupled to each other through the metalized vias 518. Likewise, the innermost conductive trace layer 516 can be electrically coupled to the conductive trace layer 296 of the second routing circuitry 29 through the metalized vias 518.

Figure 16:
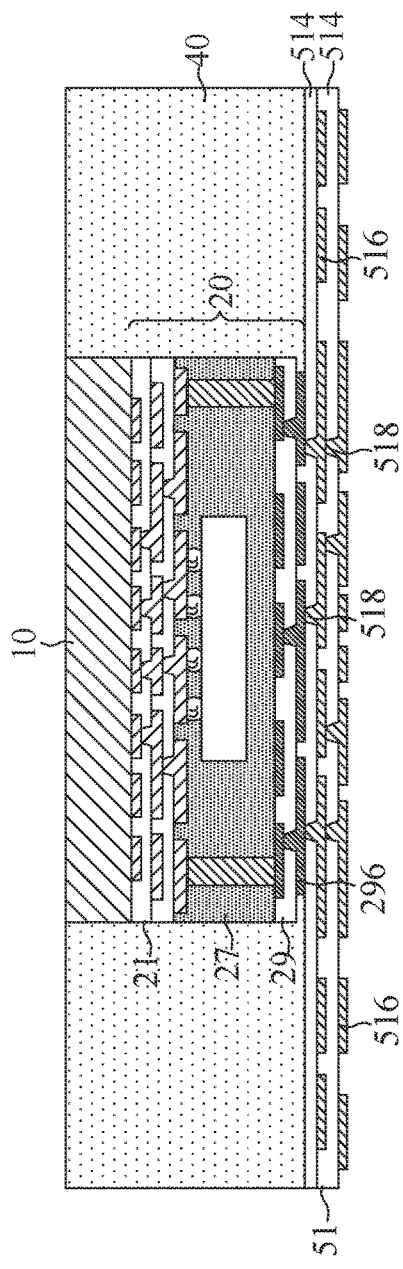
FIG. 16 is a cross-sectional view of the structure of FIG. 15 after removal of a top portion of the stiffener in accordance with the first embodiment of the present invention.

FIG. 16 is a cross-sectional view of the structure with the sacrificial carrier 10 exposed from above. The upper portion of the stiffener 40 can be removed by grinding. In this illustration, the stiffener 40 has an exterior surface substantially coplanar with an exposed surface of the sacrificial carrier 10 from above.

Figure 17:
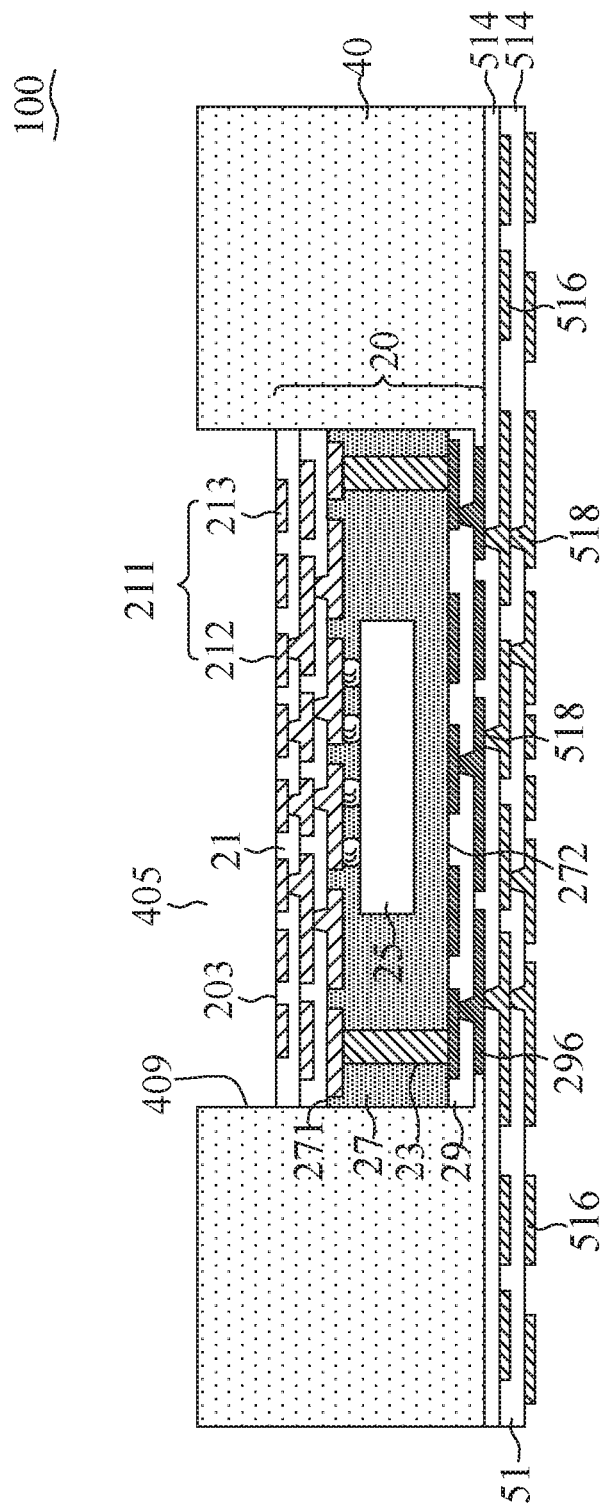
FIG. 17 is a cross-sectional view of the structure of FIG. 16 after removal of the sacrificial carrier to finish the fabrication of a wiring board in accordance with the first embodiment of the present invention.

FIG. 17 is a cross-sectional view of the structure after removal of the sacrificial carrier 10. The sacrificial carrier 10 can be removed to expose the first routing circuitry 21 from above by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 10 made of an iron-based material is removed by a chemical etching solution that is selective between copper and iron so as to prevent the copper routing layer 211 from being etched during removal of the sacrificial carrier 10. As a result, a cavity 405 is formed by an exposed surface 203 of the first routing circuitry 21 and a portion of the interior sidewall surface 409 of the stiffener 40.

Accordingly, as shown in FIG. 17, a wiring board 100 is accomplished and includes the first routing circuitry 21, the vertical connecting elements 23, the first semiconductor device 25, the encapsulant 27, the second routing circuitry 29, the stiffener 40 and the third routing circuitry 51. In this illustration, the first routing circuitry 21, the second routing circuitry 29 and the third routing circuitry 51 are multi-layered buildup circuitries without a core layer.

The first routing circuitry 21, the vertical connecting elements 23, the first semiconductor device 25, the encapsulant 27 and the second routing circuitry 29 are laterally surrounded by the stiffener 40. The first routing circuitry 21, the encapsulant 27 and the second routing circuitry 29 have peripheral edges bonded to the interior sidewall surface 409 of the stiffener 40. The first semiconductor device 25 and the vertical connecting elements 23 are sealed in the encapsulant 27 and electrically connected to the first routing circuitry 21. The first routing circuitry 21 is adjacent to the first surface 271 of the encapsulant 27 and exposed from the cavity 405. The second routing circuitry 29 is adjacent to the second surface 272 of the encapsulant 27 and electrically connected to the first routing circuitry 21 through the vertical connecting elements 23. The third routing circuitry 51 is disposed over the second routing circuitry 29, and laterally extends to peripheral edges of the wiring board 100. As such, the exposed surface 203 of the first routing circuitry 21 has a smaller area than that of the third routing circuitry 51 (namely, the area of the lower surface of the dielectric layer 514).

The third routing circuitry 51 is electrically coupled to the second routing circuitry 29 through the metallized vias 518 of the third routing circuitry 51, and includes conductive trace layers 516 extending beyond the peripheral edges of the electronic component 20. As such, the third routing circuitry 51 not only provides further fan-out wiring structure, but also mechanically binds the electronic component 20 with the stiffener 40.

The stiffener 40 surrounds the peripheral edges of the first routing circuitry 21, the encapsulant 27 and the second routing circuitry 29 and laterally extends to the peripheral edges of the wiring board 100 and can provide mechanical support and suppress warping and bending of the wiring board 100. The interior sidewall surface 409 of the stiffener 40 extends beyond the exposed surface 203 of the first routing circuitry 21 in the upward direction to surround the cavity 405.

Figure 18:
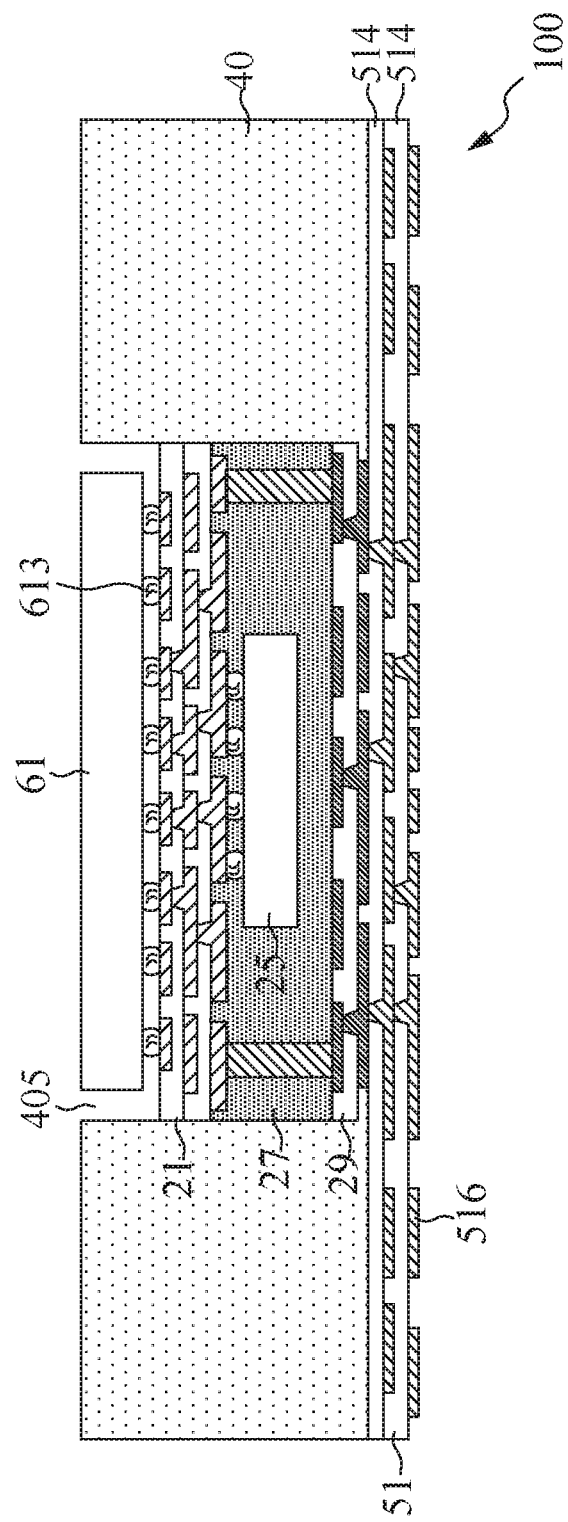
FIG. 18 is a cross-sectional view of a face-to-face semiconductor assembly with a second semiconductor device mounted on the wiring board of FIG. 17 in accordance with the first embodiment of the present invention.

FIG. 18 is a cross-sectional view of a face-to-face semiconductor assembly with a second semiconductor device 61, illustrated as a chip, mounted on the wiring board 100 illustrated in FIG. 17. The second semiconductor device 61 is positioned within the cavity 405 and is flip-chip mounted on the first routing circuitry 21 via bumps 613. As a result, the second semiconductor device 61 is face-to-face electrically connected to the first semiconductor device 25 through the first routing circuitry 21 therebetween.

Figure 19:
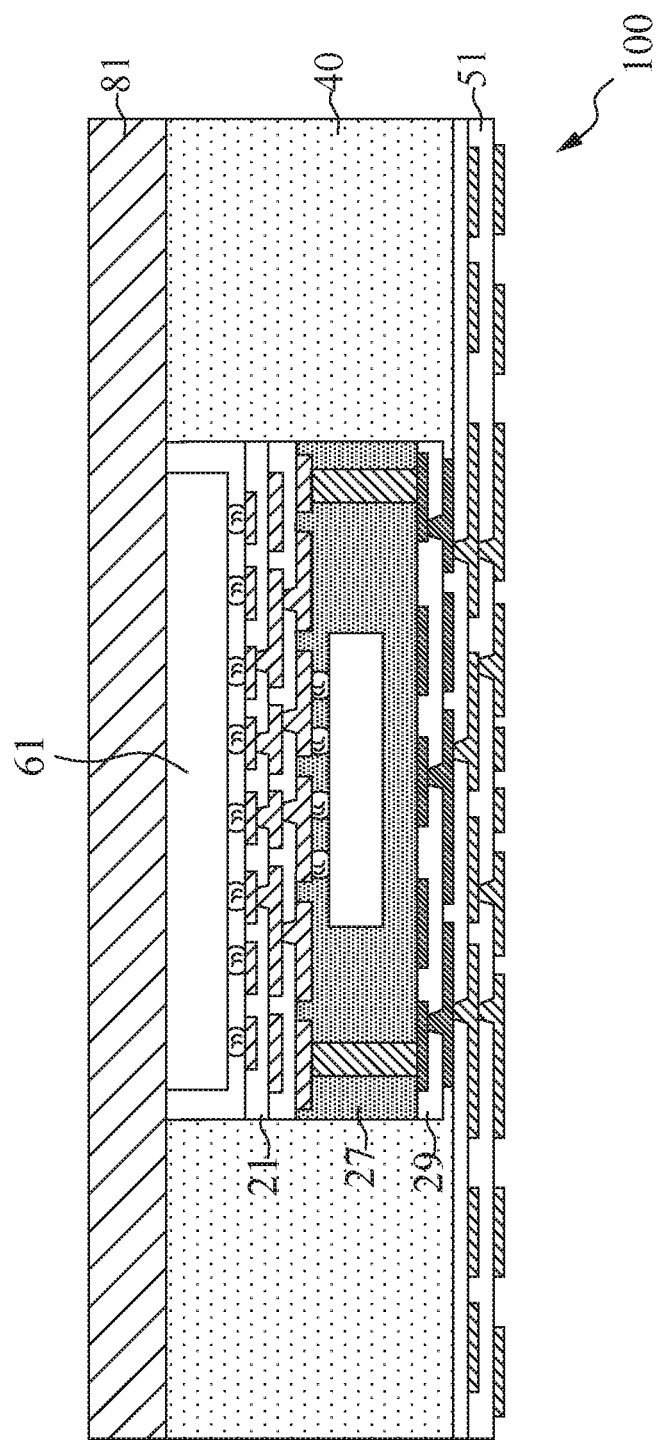
FIG. 19 is a cross-sectional view of the face-to-face semiconductor assembly of FIG. 18 further provided with a heat spreader in accordance with the first embodiment of the present invention.

FIG. 19 is a cross-sectional view of the face-to-face semiconductor assembly of FIG. 18 further provided with a heat spreader 81. The heat spreader 81 can be made of any material with high thermal conductivity, such as metal, alloy, silicon, ceramic or graphite, and is attached on an inactive surface of the second semiconductor device 61 and laterally extends onto the stiffener 40. As a result, the heat generated by the second semiconductor device 61 can be conducted away through the heat spreader 81.

Figure 20:
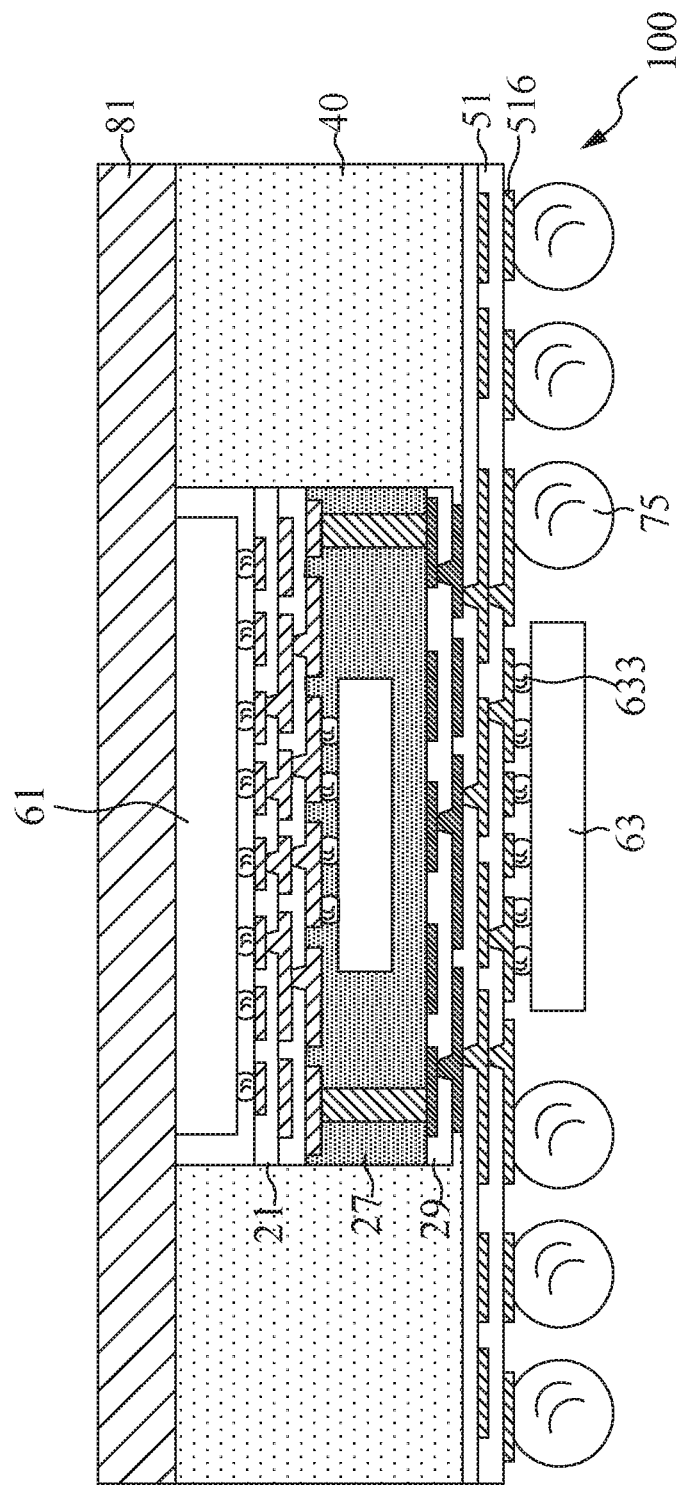
FIG. 20 is a cross-sectional view of the face-to-face semiconductor assembly of FIG. 19 further provided with a third semiconductor device and solder balls in accordance with the first embodiment of the present invention.

FIG. 20 is a cross-sectional view of the face-to-face semiconductor assembly of FIG. 19 further provided with a third semiconductor device 63 and optionally solder balls 75. The third semiconductor device 63 is flip-chip mounted on the conductive trace layer 516 of the third routing circuitry 51 via bumps 633. The solder balls 75 are mounted on the conductive trace layer 516 of the third routing circuitry 51 and surround the third semiconductor device 63.

Figure 21:
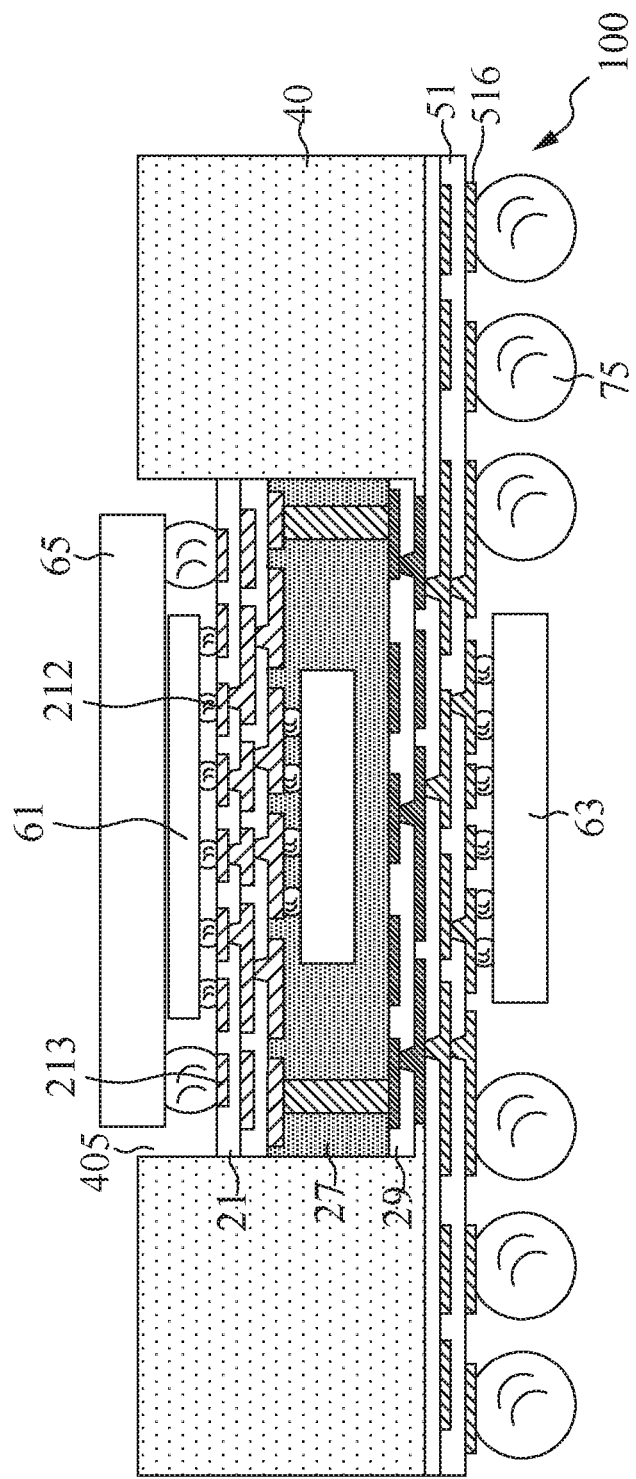
FIG. 21 is a cross-sectional view of another aspect of the face-to-face semiconductor assembly in accordance with the first embodiment of the present invention.

FIG. 21 is a cross-sectional view of another face-to-face semiconductor assembly with a second semiconductor device 61, a third semiconductor device 63, and a fourth semiconductor device 65 attached to the wiring board 100 of FIG. 17. The second semiconductor device 61 is disposed within the cavity 405 of the wiring board 100 and electrically coupled to the bond pads 212 of the first routing circuitry 21. The third semiconductor device 63 is flip-chip mounted on the conductive trace layer 516 of the third routing circuitry 51. The fourth semiconductor device 65 is disposed over the second semiconductor device 61 and electrically coupled to the stacking pads 213 of the first routing circuitry 21. Optionally, a plurality of solder balls 75 may be further mounted on the conductive trace layer 516 of the third routing circuitry 51 and surround the third semiconductor device 63.

Embodiment 2

FIGS. 22-28 are schematic views showing a method of making a wiring board having the second routing circuitry electrically coupled to the vertical connecting elements through metallized vias in the encapsulant in accordance with the second embodiment of the present invention.

For purposes of brevity, any description in Embodiment 1 above is incorporated herein insofar as the same is applicable, and the same description need not be repeated.

Figure 22:
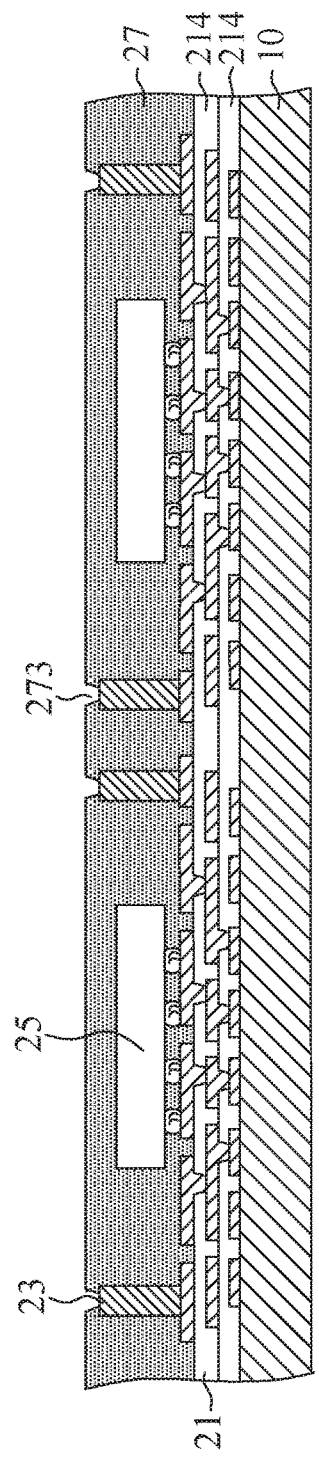
FIG. 22 is a cross-sectional view of the structure of FIG. 7 further provided with via openings in accordance with the second embodiment of the present invention.

FIG. 22 is a cross-sectional view of the structure of FIG. 7 further provided with via openings 273 in the encapsulant 27. The via openings 273 can be formed by numerous techniques, such as laser drilling, plasma etching and photolithography, and typically have a diameter of 50 microns. Laser drilling can be enhanced by a pulsed laser. Alternatively, a scanning laser beam with a metal mask can be used. The via openings 273 are aligned with selected portions of the vertical connecting elements 23 to expose the vertical connecting elements 23 from above.

Figure 23:
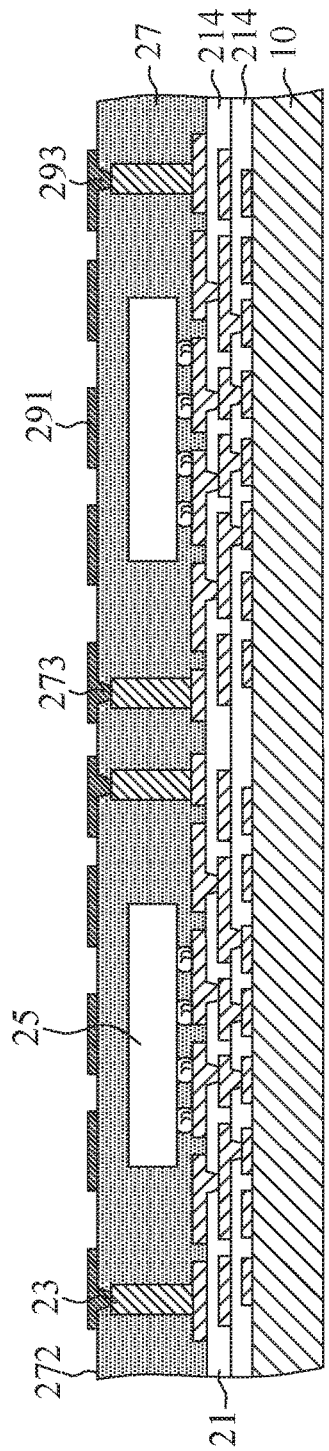
FIG. 23 is a cross-sectional view of the structure of FIG. 22 further provided with a routing layer in accordance with the second embodiment of the present invention.

FIG. 23 is a cross-sectional view of the structure provided with a routing layer 291 on the encapsulant 27 and electrically coupled to the vertical connecting elements 23 through metallized vias 293. The routing layer 291 extends from the vertical connecting elements 23 in the upward direction, fills up the via openings 273 to form the metallized vias 293 in direct contact with the vertical connecting elements 23, and extends laterally on the second surface 272 of the encapsulant 27. As a result, the routing layer 291 can provide horizontal signal routing in both the X and Y directions and vertical routing through the via openings 273 and serve as electrical connections for the vertical connecting elements 23.

FIG. 24 is a cross-sectional view of the structure with a dielectric layer 294 and a conductive trace layer 296 serially formed in an alternate fashion. The dielectric layer 294 contacts and covers and extends laterally on the encapsulant 27 and the routing layer 291 from above. The conductive trace layer 296 extends laterally on the dielectric layer 294 and includes metallized vias 298 in the dielectric layer 294. As a result, the conductive trace layer 296 can be electrically coupled to the routing layer 291 through the metalized vias 298.

At this stage, a second routing circuitry 29 is accomplished and electrically connected to the first routing circuitry 21 through the vertical connecting elements 23. In this illustration, the second routing circuitry 29 includes the routing layer 291, the dielectric layer 294 and the conductive trace layer 296.

FIG. 25 is a cross-sectional view of the panel-scale structure of FIG. 24 diced into individual pieces. In this illustration, the panel-scale structure is singulated into individual pieces along dicing lines "L".

Figure 26:
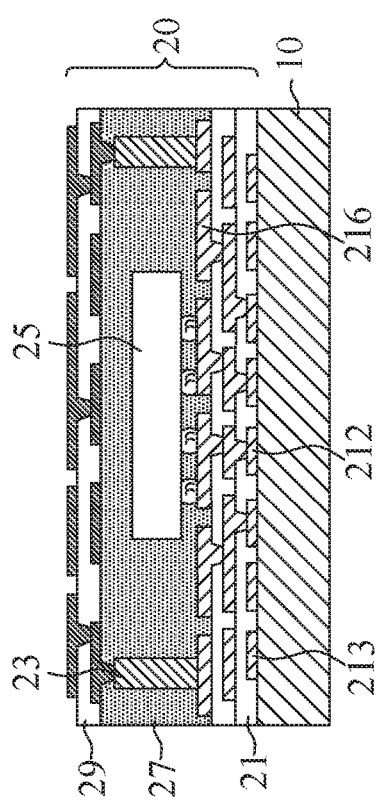
FIG. 26 is a cross-sectional view of the structure corresponding to a diced unit in FIG. 25 in accordance with the second embodiment of the present invention.

FIG. 26 is a cross-sectional view of an individual piece having a sacrificial carrier 10 and an electronic component 20. The electronic component 20 includes the first routing circuitry 21, the vertical connecting elements 23, the first semiconductor device 25, the encapsulant 27 and the second routing circuitry 29.

Figure 27:
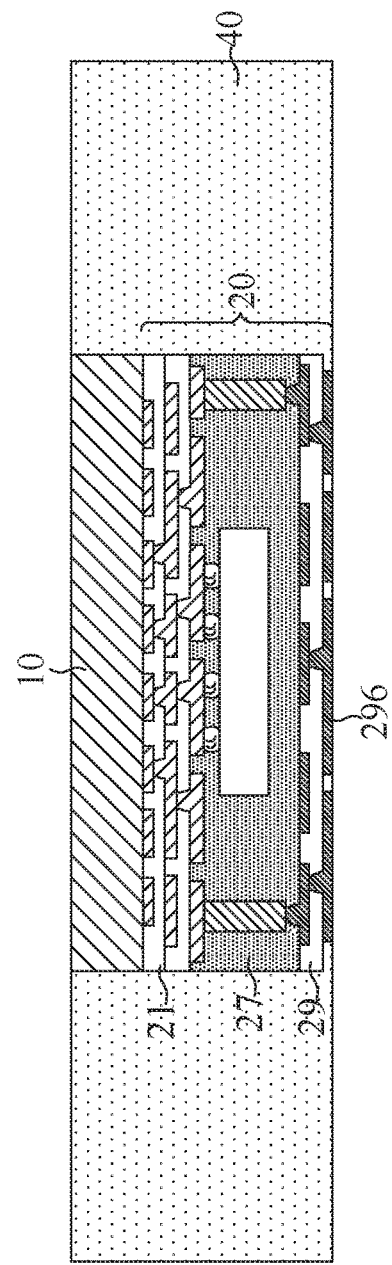
FIG. 27 is a cross-sectional view of the structure of FIG. 26 further provided with a stiffener in accordance with the second embodiment of the present invention.

FIG. 27 is a cross-sectional view of the structure provided with a stiffener 40 bonded to the peripheral edges of the sacrificial carrier 10, the first routing circuitry 21, the encapsulant 27 and the second routing circuitry 29. In this illustration, the top surface of the stiffener 40 is substantially coplanar with the exterior surface of the sacrificial carrier 10, whereas the bottom surface of the stiffener 40 is substantially coplanar with the exterior surface of the conductive trace layer 296 of the second routing circuitry 29.

Figure 28:
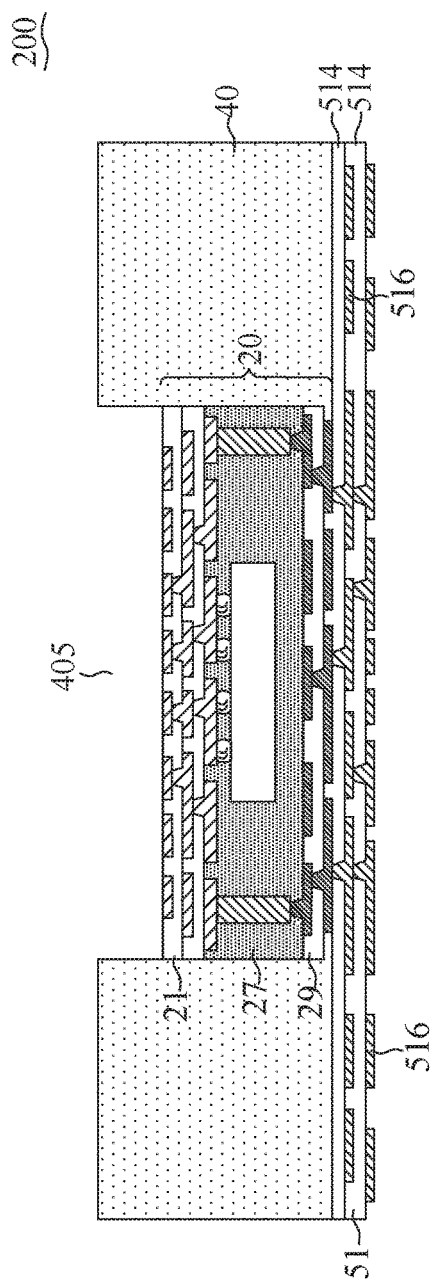
FIG. 28 is a cross-sectional view of the structure of FIG. 27 further provided with a third routing circuitry and a cavity after removal of the sacrificial carrier to finish the fabrication of a wiring board in accordance with the second embodiment of the present invention.

FIG. 28 is a cross-sectional view of a wiring board 200 after removal of the sacrificial carrier 10 and deposition of a third routing circuitry 51 electrically coupled to the electronic component 20. The sacrificial carrier 10 made of copper is removed by an alkaline etching solution. The third routing circuitry 51 laterally extends beyond peripheral edges of the second routing circuitry 29 and over a surface of the stiffener 40. In this illustration, the third routing circuitry 51 is a multi-layered buildup circuitry and includes multiple dielectric layers 514 and multiple conductive trace layers 516 serially formed in an alternate fashion. After the formation of the third routing circuitry 51, the sacrificial carrier 10 is removed to form a cavity 405.

Figure 29:
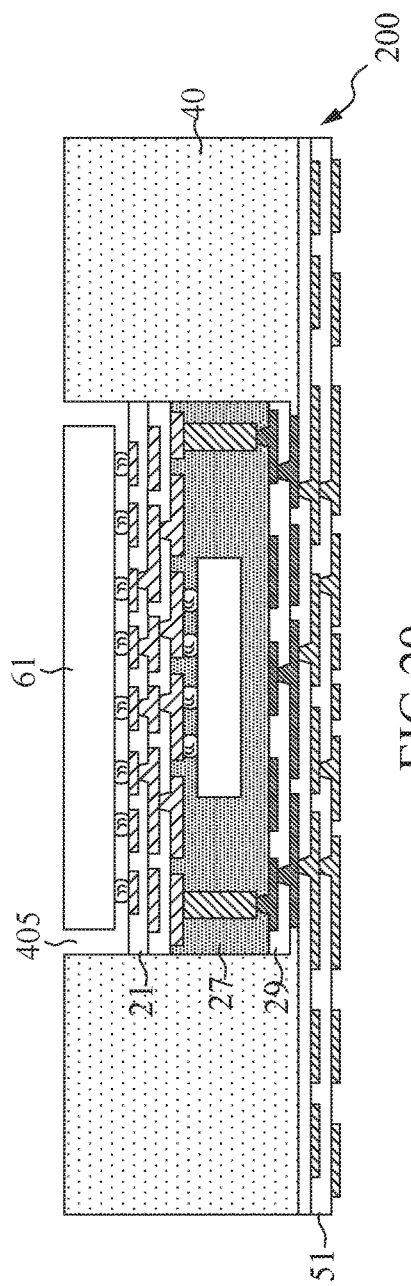
FIG. 29 is a cross-sectional view of a face-to-face semiconductor assembly with a second semiconductor device mounted on the wiring board of FIG. 28 in accordance with the second embodiment of the present invention.

FIG. 29 is a cross-sectional view of a face-to-face semiconductor assembly with a second semiconductor device 61 mounted on the first routing circuitry 21. The second semiconductor device 61, illustrated as a chip, is electrically coupled to the first routing circuitry 21 through bumps 613 on the first routing circuitry 21.

Embodiment 3

Figure 30:
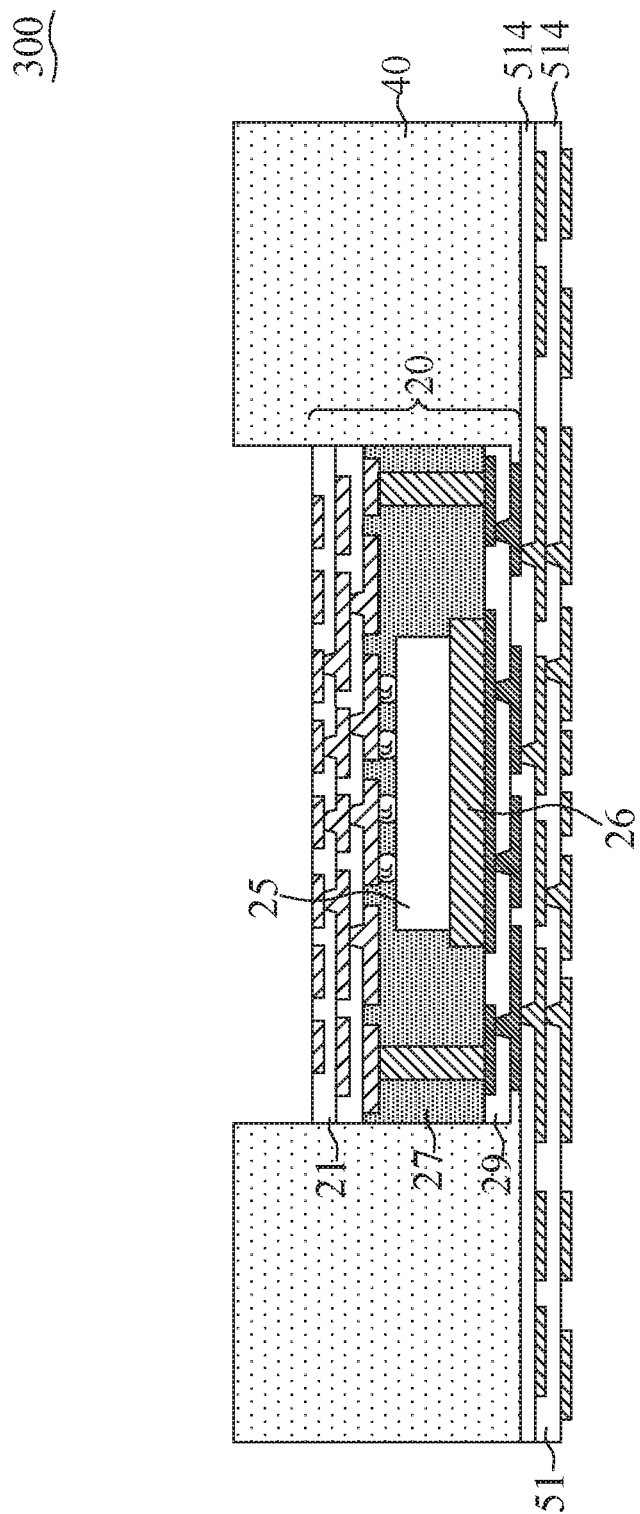
FIG. 30 is a cross-sectional view of another wiring board in accordance with the third embodiment of the present invention.

FIG. 30 is a cross-sectional view of a wiring board with a heat spreader attached to the first semiconductor device in accordance with the third embodiment of the present invention.

For purposes of brevity, any description in the Embodiments above is incorporated herein insofar as the same is applicable, and the same description need not be repeated.

The wiring board 300 is similar to that illustrated in FIG. 17, except that the electronic component 20 further includes a heat spreader 26 attached on an inactive surface of the first semiconductor device 25. The heat spreader 26 can be made of any material with high thermal conductivity, such as metal, alloy, silicon, ceramic or graphite, and is thermally conductible to the second routing circuitry 29. As a result, the heat generated by the first semiconductor device 25 can be conducted away through the heat spreader 26, the second routing circuitry 29 and the third routing circuitry 51.

Embodiment 4

Figure 31:
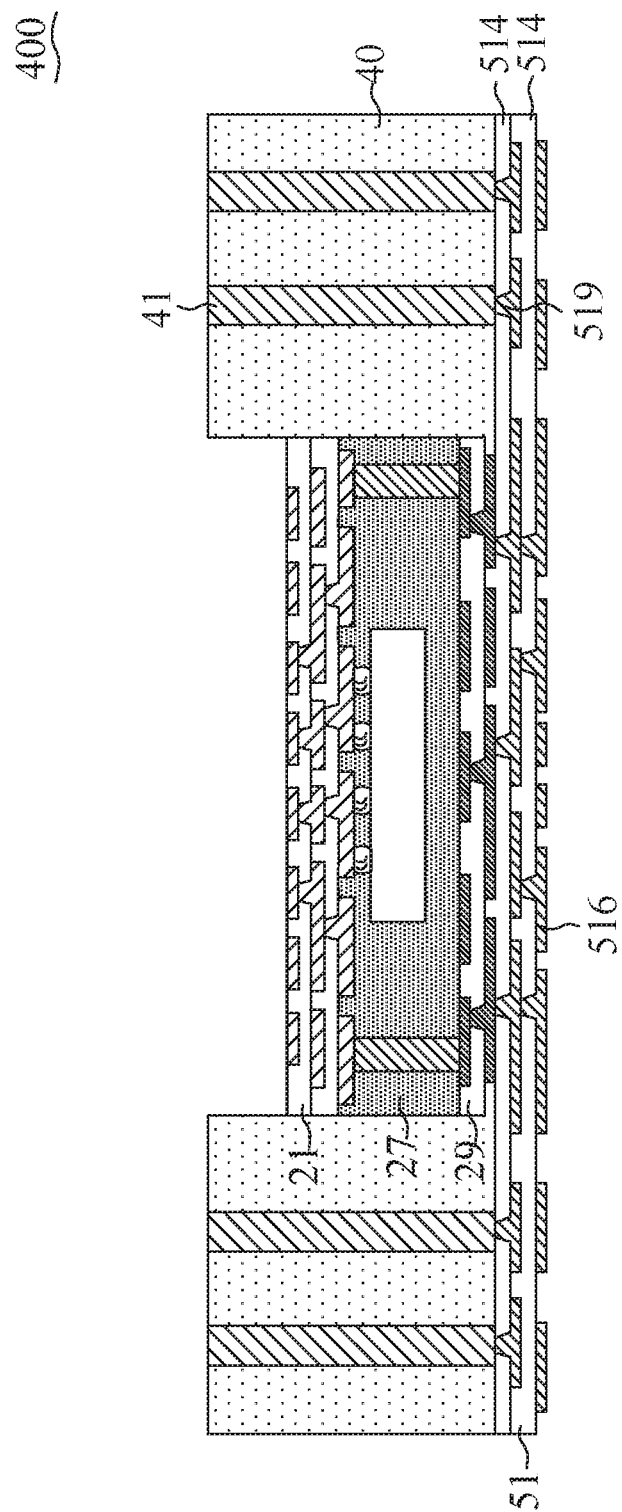
FIG. 31 is a cross-sectional view of yet another wiring board in accordance with the fourth embodiment of the present invention.

FIG. 31 is a cross-sectional view of a wiring board with the additional vertical connecting elements in the stiffener in accordance with the fourth embodiment of the present invention.

For purposes of brevity, any description in the Embodiments above is incorporated herein insofar as the same is applicable, and the same description need not be repeated.

The wiring board 400 is similar to that illustrated in FIG. 17, except that it further includes additional vertical connecting elements 41 in the stiffener 40 and electrically coupled to the third routing circuitry 51 through additional metallized vias 519 in the dielectric layer 514. In this example, the additional vertical connecting elements 41 in the stiffener 40 are illustrated as metal pillars.

Figure 32:
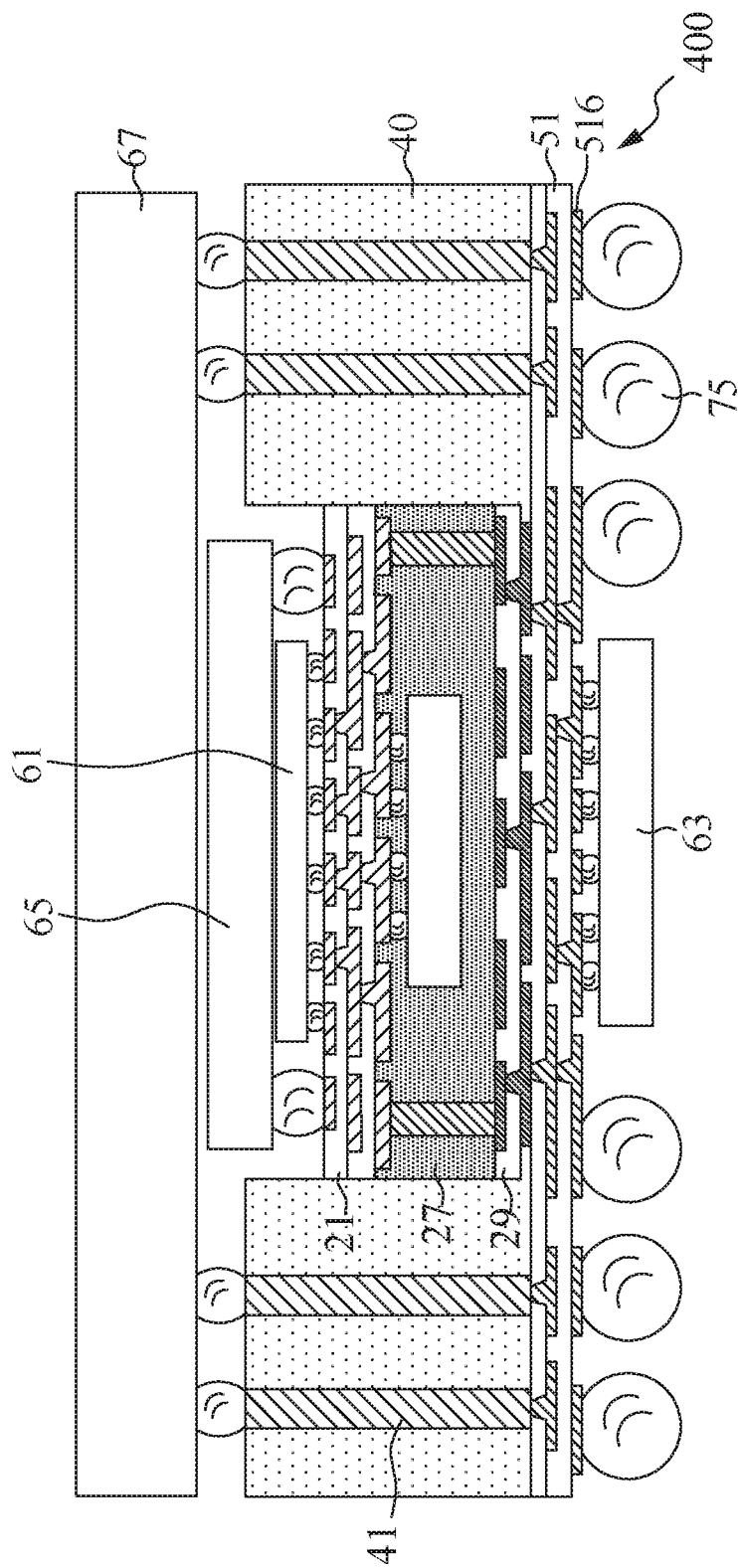
FIG. 32 is a cross-sectional view of the structure of FIG. 31 further provided with a second semiconductor device, a third semiconductor device, a fourth semiconductor device, a fifth semiconductor device and solder balls in accordance with the fourth embodiment of the present invention.

FIG. 32 is a cross-sectional view of a face-to-face semiconductor assembly with a second semiconductor device 61, a third semiconductor device 63, a fourth semiconductor device 65 and a fifth semiconductor device 67 attached to the wiring board 400 of FIG. 31. The second semiconductor device 61 is flip-chip electrically coupled to the first routing circuitry 21. The third semiconductor device 63 is flip-chip mounted on the third routing circuitry 51. The fourth semiconductor device 65 is disposed over the second semiconductor device 61 and electrically coupled to the first routing circuitry 21. The fifth semiconductor device 67 is disposed over the fourth semiconductor device 65 and the stiffener 40 and electrically coupled to the vertically connecting elements 41 in the stiffener 40. Optionally, the solder balls 75 may be further mounted on the third routing circuitry 51 and surround the third semiconductor device 63.

The wiring board and assemblies described above are merely exemplary. Numerous other embodiments are contemplated. In addition, the embodiments described above can be mixed-and-matched with one another and with other embodiments depending on design and reliability considerations. For instance, the wiring board may include multiple cavities arranged in an array and each cavity corresponds to an electronic component. Also, the third routing circuitry can include additional conductive traces to receive and route additional electronic component.

As illustrated in the aforementioned embodiments, a distinctive wiring board is configured to exhibit improved reliability, which includes a first routing circuitry, a first semiconductor device, an array of vertical connecting elements, an encapsulant, a second routing circuitry, a stiffener and a third routing circuitry. For the convenience of below description, the direction in which the first surface of the encapsulant faces is defined as the first direction, and the direction in which the second surface of the encapsulant faces is defined as the second direction. The first routing circuitry is disposed adjacent to the first surface of the encapsulant, whereas the second routing circuitry is disposed adjacent to the second surface of the encapsulant.

The first semiconductor device can be a packaged or unpackaged chip. For instance, the first semiconductor device can be a bare chip, or a wafer level packaged die, etc. Alternatively, the first semiconductor device can be a stacked-die chip. In a preferred embodiment, the first semiconductor device is electrically coupled to the first routing circuitry detachably adhered over a sacrificial carrier and is laterally surrounded by the vertical connecting elements, followed by providing the encapsulant over the first routing circuitry and then forming the second routing circuitry over the encapsulant to form an electronic component over the sacrificial carrier. In this case, the first semiconductor device can be electrically coupled to the first routing circuitry using bumps with its active surface facing the first routing circuitry. Preferably, the combination of the electronic component and the sacrificial carrier is fabricated by a panel scale process followed by a singulation process. Further, before the step of providing the encapsulant, a heat spreader may be attached to the first semiconductor device. As a result, the heat generated by the first semiconductor device can be conducted away through the heat spreader.

The vertical connecting elements in the encapsulant can have a thickness substantially equal to or less than that of the encapsulant and provide electrical contacts for next routing circuitry connection. Specifically, the vertical connecting elements are located between the first routing circuitry and the second routing circuitry, and have two opposite ends electrically coupled to the first routing circuitry and the second routing circuitry, respectively.

The stiffener, located around peripheral edges of the first routing circuitry, the encapsulant and the second routing circuitry, can be made of a material having enough mechanical robustness to provide mechanical support for the wiring board and suppress warping and bending of the wiring board. In a preferred embodiment, the stiffener is directly bonded to peripheral edges of the electronic component and the sacrificial carrier and laterally extends to the peripheral edges of the wiring board. Optionally, additional vertical connecting elements may be formed in the stiffener to provide electrical contacts for another semiconductor device or for a heat spreader mounted on the stiffener from the first direction.

The first routing circuitry, the second routing circuitry and the third routing circuitry can be buildup routing circuitries without a core layer. The first routing circuitry and the second routing circuitry are disposed within the space surrounded by the interior sidewall surface of the stiffener, whereas the third routing circuitry is disposed outside of the space surrounded by the interior sidewall surface of the stiffener and laterally extends over a surface of the stiffener. Specifically, the third routing circuitry laterally extends beyond the peripheral edges of the first routing circuitry and the second routing circuitry, and can have a larger surface area than that of the first routing circuitry and the second routing circuitry. Preferably, the third routing circuitry extends to peripheral edges of the wiring board and substantially has a combined surface area of the second routing circuitry and the stiffener.

The first routing circuitry can include at least one dielectric layer and at least one conductive trace layer that includes metallized vias in the dielectric layer and extends laterally on the dielectric layer. The dielectric layer and the conductive trace layer are serially formed in an alternate fashion and can be in repetition when needed. For instance, the first routing circuitry may include a routing layer on the sacrificial carrier, a dielectric layer on the routing layer and the sacrificial carrier, and a conductive trace layer that extends from selected portions of the routing layer and extends through the dielectric layer to form metallized vias and laterally extends on the dielectric layer. Further, the first routing circuitry may include additional dielectric layers and additional conductive trace layers if needed for further signal routing. Also, the first routing circuitry may optionally include one or more passive components embedded therein. In the present invention, the step of forming the first routing circuitry on the sacrificial carrier can be executed by directly forming the first routing circuitry on the sacrificial carrier, or by separately forming and then detachably adhering the first routing circuitry to the sacrificial carrier. For the first routing circuitry, the routing layer can includes bond pads that match chip I/O pads. Optionally, the routing layer may further include stacking pads to provide electrical contacts for another semiconductor device such as a plastic package or another semiconductor assembly. As a result, the first routing circuitry can be a multi-layered routing circuitry, and have bond pads and optional stacking pads at its exposed surface. Accordingly, in a preferred embodiment, the first routing circuitry provides first level routing/interconnection for a second semiconductor device to be assembled on its exposed surface. The surfaces, facing in the first direction, of the bond pads, the optional stacking pads and the dielectric layer adjacent to the sacrificial carrier can be substantially coplanar with each other. Further, the stiffener can extend beyond the exposed surface of the first routing circuitry in the first direction so as to form a cavity after removing the sacrificial carrier to expose the first routing circuitry. Accordingly, a second semiconductor device can be positioned within the cavity and electrically coupled to the bond pads exposed from the cavity.

The second routing circuitry can include a routing layer extending laterally on the second surface of the encapsulant and electrically coupled to the vertical connecting elements and thermally conductible to the optional heat spreader on an inactive surface of the first semiconductor device. Additionally, the second routing circuitry may further include at least one dielectric layer and at least one conductive trace layer that includes metallized vias in the dielectric layer and extends laterally on the dielectric layer. The dielectric layer and the conductive trace layer are serially formed in an alternate fashion and can be in repetition when needed. The innermost conductive layer, adjacent to the routing layer, of the second routing circuitry can be electrically coupled to the routing layer through metallized vias in contact with the routing layer, whereas the outmost conductive layer, adjacent to the third routing circuitry, of the second routing circuitry can provide electrical contacts for next-level routing circuitry connection. As a result, the second routing circuitry can provide electrical connection between the vertical connecting elements and the third routing circuitry.

The third routing circuitry can be formed on the second routing circuitry and laterally extend over a surface of the stiffener to provide further fan-out routing/interconnection. As the third routing circuitry can be electrically coupled to the second routing circuitry of the electronic component through metallized vias of the third routing circuitry, the electrical connection between the second routing circuitry and the third routing circuitry can be devoid of soldering material. Also, the interface between the stiffener and the third routing circuitry and between the second routing circuitry and the third routing circuitry can be devoid of solder or adhesive. More specifically, the third routing circuitry can include at least one dielectric layer and at least one conductive trace layer that includes metallized vias in the dielectric layer and extends laterally on the dielectric layer. The dielectric layer and the conductive trace layer are serially formed in an alternate fashion and can be in repetition when needed. For instance, the third routing circuitry may include a dielectric layer that covers the electronic component and the stiffener from the second direction, and a conductive trace layer that extends from the second routing circuitry and optionally from the additional connecting vertical elements in the stiffener and extends through the dielectric layer to form metallized vias and laterally extends on the dielectric layer. Further, the third routing circuitry may include additional dielectric layers and additional conductive trace layers if needed for further signal routing. As a result, the third routing circuitry can contact and be electrically coupled to the second routing circuitry of the electronic component for signal routing, and optionally further electrically coupled to the optional vertical connecting elements in the stiffener for signal routing or grounding. The outmost conductive trace layer of the third routing circuitry can accommodate conductive joints, such as bumps and solder balls, for electrical communication and mechanical attachment with for the next level assembly or another electronic device.

The present invention also provides a face-to-face semiconductor assembly in which a second semiconductor device is electrically coupled to the bond pads of the aforementioned wiring board. Specifically, the second semiconductor device can be positioned in the cavity of the wiring board and electrically connected to the wiring board using various using a wide variety of connection media such as bumps on the bond pads of the wiring board. Accordingly, the second semiconductor device can be electrically connected to the first semiconductor device through the first routing circuitry therebetween, and further electrically connected to the third routing circuitry through the first routing circuitry, the vertical connecting elements and the second routing circuitry. In the face-to-face semiconductor assembly, the first routing circuitry can offer the shortest interconnection distance between the first semiconductor device and second semiconductor device. The second semiconductor device can be a packaged or unpackaged chip. For instance, the second semiconductor device can be a bare chip, or a wafer level packaged die, etc. Alternatively, the second semiconductor device can be a stacked-die chip.

Moreover, an additional semiconductor device may be further provided and electrically coupled to the stacking pads of the wiring board using conductive joints such as solder balls. For instance, the additional semiconductor device can be positioned above the second semiconductor device and electrically coupled to the stacking pads of the wiring board. Alternatively, a heat spreader may be attached to an inactive surface of the second semiconductor device.

The term "cover" refers to incomplete or complete coverage in a vertical and/or lateral direction. For instance, in the cavity-up position, the second routing circuitry covers the first routing circuitry in the downward direction regardless of whether additional elements such as the first semiconductor device, the vertical connecting elements and the encapsulant are between the first routing circuitry and the second routing circuitry.

The phrases "mounted on" and "attached on" include contact and non-contact with a single or multiple element(s). For instance, the optional heat spreader can be attached on the second semiconductor device regardless of whether it contacts the second semiconductor device or is separated from the second semiconductor device by a thermally conductive adhesive or solder balls.

The phrases "electrical connection", "electrically connected" and "electrically coupled" refer to direct and indirect electrical connection. For instance, in a preferred embodiment, the second routing circuitry directly contacts and is electrically connected to the vertical connecting elements, whereas the third routing circuitry is spaced from and electrically connected to the vertical connecting elements by the second routing circuitry.

The "first direction" and "second direction" do not depend on the orientation of the wiring board, as will be readily apparent to those skilled in the art. For instance, the first surface of the encapsulant faces the first direction and the second surface of the encapsulant faces the second direction regardless of whether the wiring board is inverted. Thus, the first and second directions are opposite one another and orthogonal to the lateral directions. Furthermore, the first direction is the upward direction and the second direction is the downward direction in the cavity-up position, and the first direction is the downward direction and the second direction is the upward direction in the cavity-down position.

The wiring board according to the present invention has numerous advantages. For instance, the first semiconductor device is electrically coupled to the first routing circuitry by a well-known flip chip bonding process such as thermocompression or solder reflow, which can avoid the positional accuracy issue inherent in most stackable approaches where an adhesive carrier is used for temporary bonding. The first routing circuitry provides the first level fan-out routing/interconnection for a second semiconductor device to be assembled thereon, whereas the second routing circuitry on the encapsulant provides the second level fan-out routing/interconnection. The third routing circuitry on the second routing circuitry and the stiffener provides the third level fan-out routing/interconnection and electrical contacts for next-level board assembling. As such, the second semiconductor device with fine pads can be electrically coupled to one side of the first routing circuitry with pad pitch that matches the second semiconductor device, and the third routing circuitry is electrically connected to the other side of the first routing circuitry through the second routing circuitry and the vertical connecting elements and further enlarges the pad size and pitch of the second semiconductor device. The stiffener can provide an anti-warping platform for the third routing circuitry formation thereon to suppress warping and bending of the wiring board. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A wiring board, comprising:
an electronic component that includes a first semiconductor device having an active surface, an encapsulant, an array of vertical connecting elements each having a first end and a second end, a first routing circuitry and a second routing circuitry, wherein (i) the encapsulant laterally covers the first semiconductor device and the vertical connecting elements and has a first surface facing the first routing circuitry and a second surface opposite to the first surface, (ii) the first routing circuitry extends over the first surface of the encapsulant, the active surface of the first semiconductor device, and the first ends of the vertical connecting elements, thereby electrically coupling the first semiconductor device and the vertical connecting elements to the first routing circuitry, and (iii) the second routing circuitry is disposed on the second surface of the encapsulant and on the second ends of the vertical connecting elements so that the second routing circuitry is electrically connected to the first routing circuitry through the vertical connecting elements;

a stiffener that laterally surrounds the electronic component and has an interior sidewall surface adjacent to peripheral edges of the electronic component; and a third routing circuitry that is disposed over the second routing circuitry and laterally extends over the stiffener, wherein the third routing circuitry is electrically coupled to the second routing circuitry.

2. The wiring board of claim 1, wherein the third routing circuitry includes at least one conductive trace laterally extending beyond peripheral edges of the second routing circuitry.

3. The wiring board of claim 1, further comprising additional vertical connecting elements in the stiffener, wherein the additional vertical connecting elements are electrically coupled to the third routing circuitry.

4. The wiring board of claim 1, wherein the first routing circuitry has an exposed surface facing away from the first surface of the encapsulant.

5. The wiring board of claim 4, wherein a portion of the interior sidewall surface of the stiffener and the exposed surface of the first routing circuitry form a cavity.

6. A face-to-face semiconductor assembly, comprising:
the wiring board of claim 1; and
a second semiconductor device face-to-face electrically coupled to the first semiconductor device through the first routing circuitry between the first semiconductor device and the second semiconductor device.

7. The face-to-face semiconductor assembly of claim 6, wherein a portion of the interior sidewall surface of the stiffener and a surface of the first routing circuitry form a cavity, and the second semiconductor device is disposed in the cavity.

8. The face-to-face semiconductor assembly of claim 6, wherein the wiring board further comprises additional vertical connecting elements in the stiffener, and the additional vertical connecting elements are electrically coupled to the third routing circuitry.

9. The face-to-face semiconductor assembly of claim 6, further comprising a heat spreader that is attached to an inactive surface of the second semiconductor device and laterally extends over the stiffener.

10. A method of making a wiring board, comprising:
providing an electronic component over a sacrificial carrier, the electronic component including a semiconductor device having an active surface, an encapsulant, an array of vertical connecting elements each having a first end and a second end, a first routing circuitry and a second routing circuitry, wherein (i) the first routing circuitry is detachably adhered over the sacrificial carrier and the encapsulant has a first surface facing and adjacent to the first routing circuitry, (ii) the semiconductor device and the vertical connecting elements are laterally covered by the encapsulant, (iii) the first routing circuitry extends over the first surface of the encapsulant, the active surface of the first semiconductor device, and the first ends of the vertical connecting elements, thereby electrically coupling the first semiconductor device and the vertical connecting elements to the first routing circuitry, and (iv) the second routing circuitry is disposed on a second surface of the encapsulant opposite to the first surface and on the second ends of the vertical connecting elements so that the second routing circuitry is electrically connected to the first routing circuitry through the vertical connecting elements;

providing a stiffener that laterally surrounds the electronic component and the sacrificial carrier and has an interior sidewall surface adjacent to peripheral edges of the electronic component;

forming a third routing circuitry that is disposed over the second routing circuitry and laterally extends over the stiffener, wherein the third routing circuitry is electrically coupled to the second routing circuitry; and removing the sacrificial carrier from the first routing circuitry.

11. The method of claim 10, wherein the step of providing the electronic component over the sacrificial carrier includes:
providing the first routing circuitry detachably adhered over the sacrificial carrier;
electrically coupling the semiconductor device to the first routing circuitry using bumps between the active surface of the semiconductor device and the first routing circuitry;
forming the vertical connecting elements;
providing the encapsulant on the first routing circuitry; and
forming the second routing circuitry on the encapsulant.

12. The method of claim 10, wherein the step of forming the third routing circuitry includes electrically coupling the third routing circuitry to additional vertical connecting elements in the stiffener.

* * * * *